United States Patent
Chang et al.

(10) Patent No.: US 12,362,234 B2
(45) Date of Patent: Jul. 15, 2025

(54) CONTACT STRUCTURE FOR SEMICONDUCTOR DEVICE

(71) Applicant: Taiwan Semiconductor Manufacturing Company, Ltd., Hsinchu (TW)

(72) Inventors: Hsu-Kai Chang, Hsinchu (TW); Chia-Hung Chu, Taipei (TW); Shuen-Shin Liang, Hsinchu County (TW); Keng-Chu Lin, Ping-Tung (TW); Pinyen Lin, Rochester, NY (US); Sung-Li Wang, Zhubei (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 441 days.

(21) Appl. No.: 17/459,799

(22) Filed: Aug. 27, 2021

(65) Prior Publication Data
US 2023/0061022 A1    Mar. 2, 2023

(51) Int. Cl.
*H01L 21/768*    (2006.01)
*H01L 23/522*    (2006.01)
*H01L 23/532*    (2006.01)

(52) U.S. Cl.
CPC .. *H01L 21/76844* (2013.01); *H01L 21/76805* (2013.01); *H01L 21/76816* (2013.01); *H01L 21/76876* (2013.01); *H01L 21/76877* (2013.01); *H01L 23/5226* (2013.01); *H01L 23/53266* (2013.01)

(58) Field of Classification Search
CPC ......... H01L 21/76844; H01L 21/76805; H01L 21/76816; H01L 21/76876; H01L 21/76877; H01L 21/28556; H01L 23/5226; H01L 23/53266; H01L 29/78; H01L 29/66007
See application file for complete search history.

(56) References Cited

U.S. PATENT DOCUMENTS

| | | |
|---|---|---|
| 9,093,530 B2 | 7/2015 | Huang et al. |
| 9,171,929 B2 | 10/2015 | Lee et al. |
| 9,214,555 B2 | 12/2015 | Oxland et al. |
| 9,236,267 B2 | 1/2016 | De et al. |
| 9,520,482 B1 | 12/2016 | Chang et al. |
| 9,548,303 B2 | 1/2017 | Lee et al. |
| 9,564,489 B2 | 2/2017 | Yeo et al. |
| 9,576,814 B2 | 2/2017 | Wu et al. |
| 9,601,342 B2 | 3/2017 | Lee et al. |

(Continued)

*Primary Examiner* — Britt D Hanley
*Assistant Examiner* — Vicki B. Booker
(74) *Attorney, Agent, or Firm* — Sterne, Kessler, Goldstein & Fox P.L.L.C.

(57) ABSTRACT

The present disclosure describes a semiconductor structure and a method for forming the same. The semiconductor structure can include a substrate, a gate structure over the substrate, a source/drain (S/D) contact structure adjacent to the gate structure, a layer of dielectric material over the S/D contact structure and over the gate structure, a layer of organometallic material formed through the layer of dielectric material, and a trench conductor layer formed through the layer of dielectric material and in contact with the S/D contact structure and the gate structure. The layer of organometallic material can be between the layer of dielectric material and the trench conductor layer.

20 Claims, 26 Drawing Sheets

(56) References Cited

U.S. PATENT DOCUMENTS

| | | | |
|---|---|---|---|
| 9,608,116 B2 | 3/2017 | Ching et al. | |
| 2007/0099420 A1* | 5/2007 | Dominguez | C23C 16/45525 |
| | | | 257/E21.171 |
| 2010/0200991 A1* | 8/2010 | Akolkar | C23C 16/45529 |
| | | | 257/E23.161 |
| 2012/0049370 A1* | 3/2012 | Wada | H01L 21/76877 |
| | | | 438/643 |
| 2015/0048511 A1* | 2/2015 | Tsai | H01L 21/76879 |
| | | | 257/763 |
| 2015/0118837 A1* | 4/2015 | Shieh | H01L 21/76879 |
| 2015/0380305 A1* | 12/2015 | Basker | H01L 21/845 |
| | | | 257/77 |
| 2016/0071803 A1* | 3/2016 | Saito | H01L 21/76843 |
| | | | 257/746 |
| 2020/0006127 A1* | 1/2020 | Khaderbad | H01L 21/76834 |

\* cited by examiner

CONTACT STRUCTURE FOR SEMICONDUCTOR DEVICE

BACKGROUND

Advances in semiconductor technology have increased the demand for semiconductor devices with higher storage capacity, faster processing systems, higher performance, and lower costs. To meet these demands, the semiconductor industry continues to scale down the dimensions of semiconductor devices. Such scaling down has increased the complexity of semiconductor device manufacturing processes.

BRIEF DESCRIPTION OF THE DRAWINGS

Aspects of this disclosure are best understood from the following detailed description when read with the accompanying figures.

FIGS. 5A-14A and 5B-14B illustrate cross-sectional views of a semiconductor device at various stages of its fabrication process, according to some embodiments.

Illustrative embodiments will now be described with reference to the accompanying drawings. In the drawings, like reference numerals generally indicate identical, functionally similar, and/or structurally similar elements.

DETAILED DESCRIPTION

Figure 1:
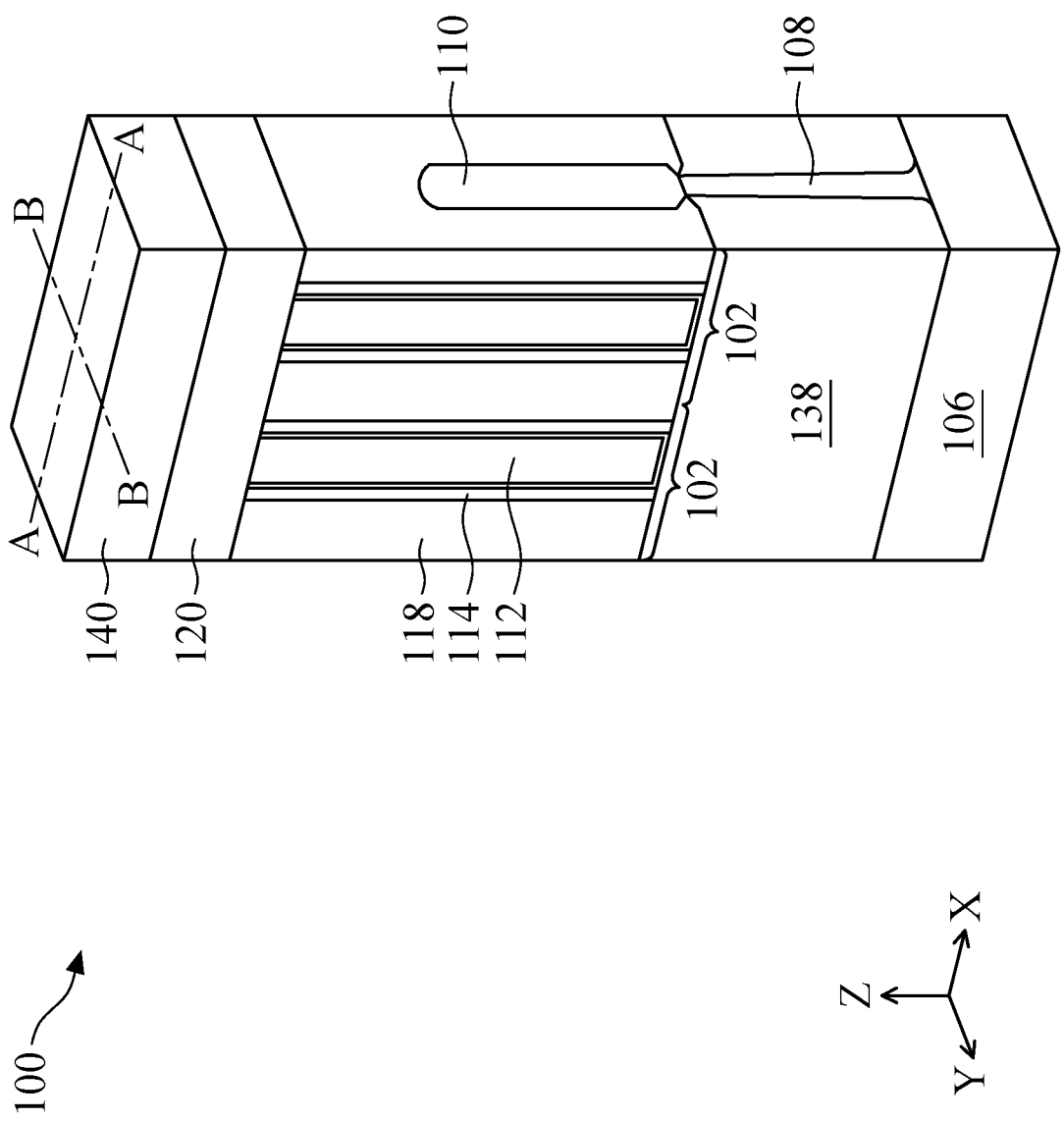
FIG. 1 illustrates an isometric view of a semiconductor device, according to some embodiments.

It is noted that references in the specification to "one embodiment," "an embodiment," "an example embodiment," "exemplary," etc., indicate that the embodiment described may include a particular feature, structure, or characteristic, but every embodiment may not necessarily include the particular feature, structure, or characteristic. Moreover, such phrases do not necessarily refer to the same embodiment. Further, when a particular feature, structure or characteristic is described in connection with an embodiment, it would be within the knowledge of one skilled in the art to effect such feature, structure or characteristic in connection with other embodiments whether or not explicitly described.

It is to be understood that the phraseology or terminology herein is for the purpose of description and not of limitation, such that the terminology or phraseology of the present specification is to be interpreted by those skilled in relevant art(s) in light of the teachings herein.

Spatially relative terms, such as "beneath," "below," "lower," "above," "upper," and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

The term "nominal" as used herein refers to a desired, or target, value of a characteristic or parameter for a component or a process operation, set during the design phase of a product or a process, with a range of values above and/or below the desired value. The range of values is typically due to slight variations in manufacturing processes or tolerances.

In some embodiments, the terms "about" and "substantially" can indicate a value of a given quantity that varies within 5% of the value (e.g., ±1%, ±2%, ±3%, ±4%, ±5% of the value). These values are merely examples and are not intended to be limiting. The terms "about" and "substantially" can refer to a percentage of the values as interpreted by those skilled in relevant art(s) in light of the teachings herein.

As used herein, the term "vertical" means nominally perpendicular to the surface of a substrate.

Fins associated with fin field effect transistors (finFETs) or gate-all-around (GAA) FETs may be patterned by any suitable method. For example, the fins may be patterned using one or more photolithography processes, including a double-patterning process or a multi-patterning process. Double-patterning and multi-patterning processes can combine photolithography and self-aligned processes, allowing patterns to be created that have, for example, pitches smaller than what is otherwise obtainable using a single, direct photolithography process. For example, a sacrificial layer is formed over a substrate and patterned using a photolithography process. Spacers are formed alongside the patterned sacrificial layer using a self-aligned process. The sacrificial layer is then removed, and the remaining spacers may then be used to pattern the fins.

Technology advances in the semiconductor industry drive the pursuit of integrated circuits (ICs) having higher device density, higher performance, and lower cost. The IC can include a transistor structure with a contact structure (e.g., a gate contact structure). During the fabrication of the IC, the contact structure can be formed by (i) performing an etching process to form a via structure to expose the transistor's gate structure, and (ii) performing a deposition process to fill a conductive material in the via structure to contact the exposed gate structure. However, the side surfaces of the via structure can be damaged during the etching process of forming the via structure. The damaged side surface of the via structure can result in a non-uniform lateral deposition rate of the conductive material in the via structure. For example, the damaged side surface can cause the deposition process to deposit the conductive material at a higher deposition rate proximate to the via structure's upper portion than proximate to the via structure's lower portion. With the scaling down of the contact structure's size, the above-noted non-uniform lateral deposition rate can seal the via structure before filling the bottom portion of the via structure, thus forming void structures in the resulting contact structure ("pinch-off"). The pinch-off of the contact structure can degrade the yield and the reliability of the IC.

To address the aforementioned challenges, the present disclosure is directed to a fabrication method and a transistor structure with a contact structure. The transistor structure can include a gate structure, a source/drain (S/D) region adjacent to the gate structure, and a S/D contact formed over the S/D region. The contact structure can include a trench conductor layer to electrically bridge the IC's interconnect structure with the transistor structure's gate structure and S/D contact. The trench conductor layer can be made of a conductive material, such as a platinum-group metallic material. The contact structure can further include an organometallic layer, such as an organoaluminum layer, formed over the trench conductor layer's side surfaces. The organometallic layer can ensure a conformal growth of the conductive material during a deposition process, such as a chemical vapor deposition (CVD) process, that is used to form the trench conductor layer. For example, the organometallic layer can provide a substantially uniform nucleation rate for the deposition process to uniformly deposit the conductive material over a via dielectric layer's side surfaces to form the trench conductor layer. Accordingly, the resulting trench conductor layer can be a seamless and void-free structure. Therefore, a benefit of the present disclosure, among others, is to provide the contact structure with reliable structural integrity (e.g., avoid void formation), thus enhancing an overall yield and reliability of the IC.

Figure 2A:
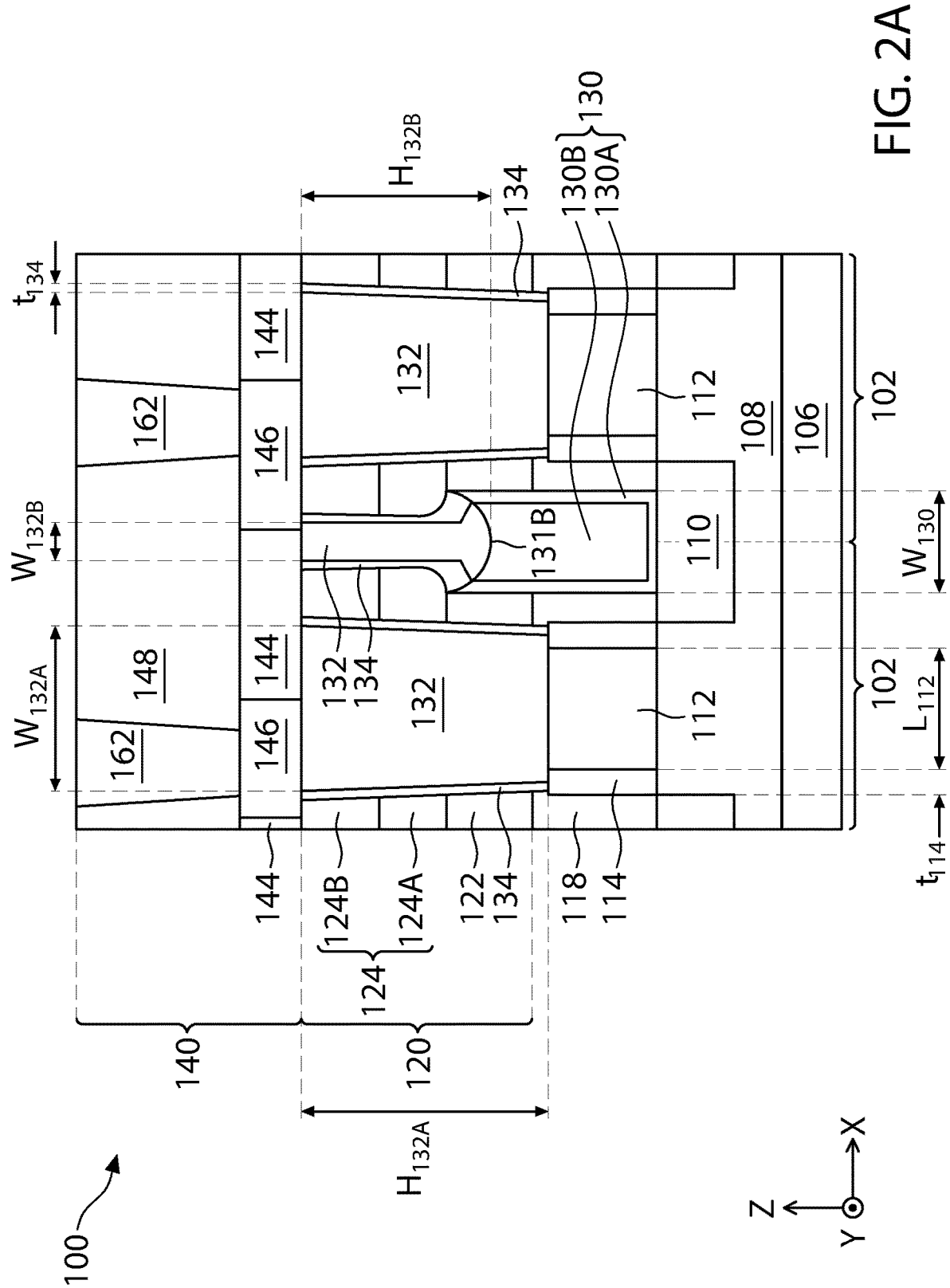
FIGS. 2A, 2B, 3A, and 3B illustrate cross-sectional views of a semiconductor device, according to some embodiments.
Figure 2B:
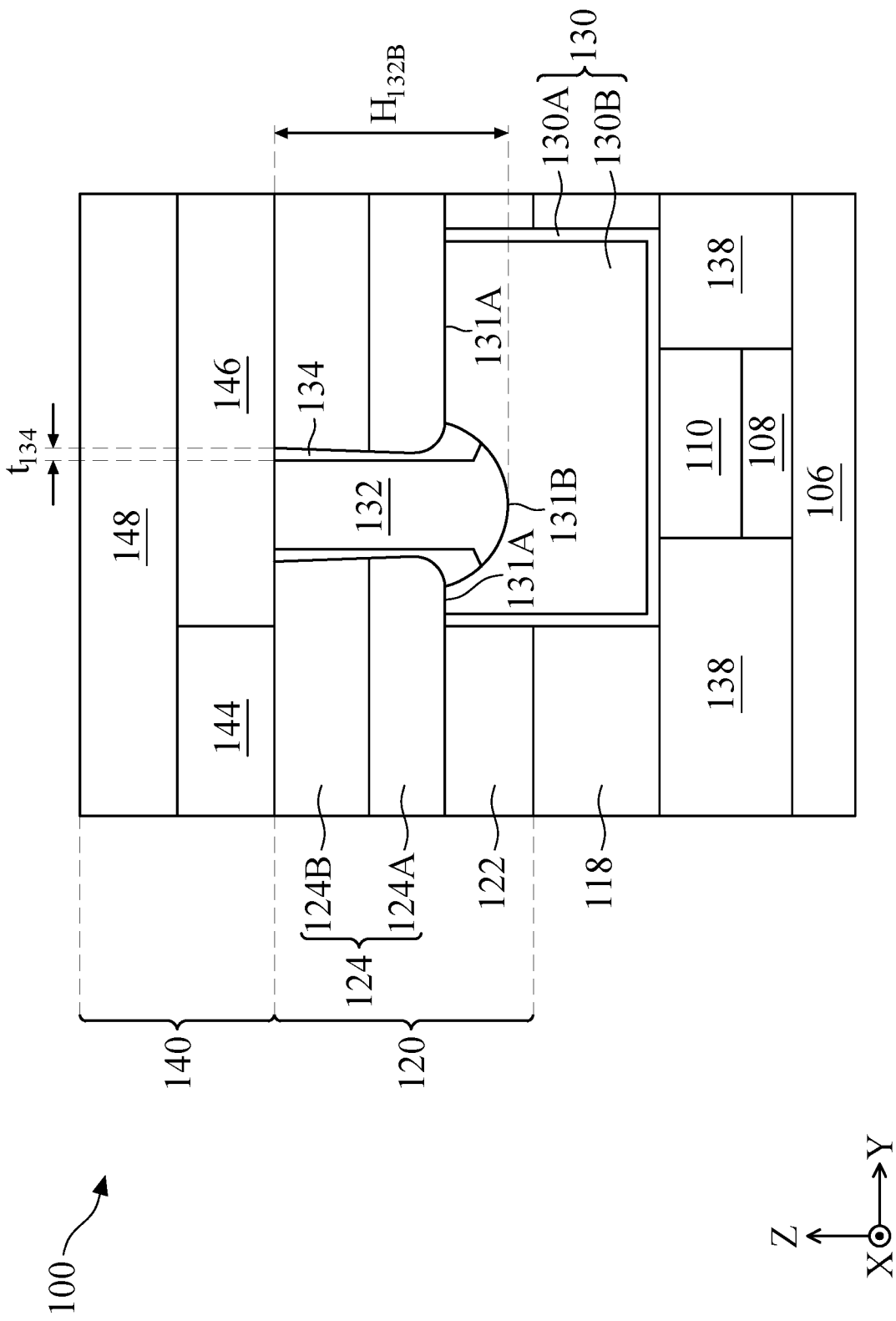
Figure 3A:
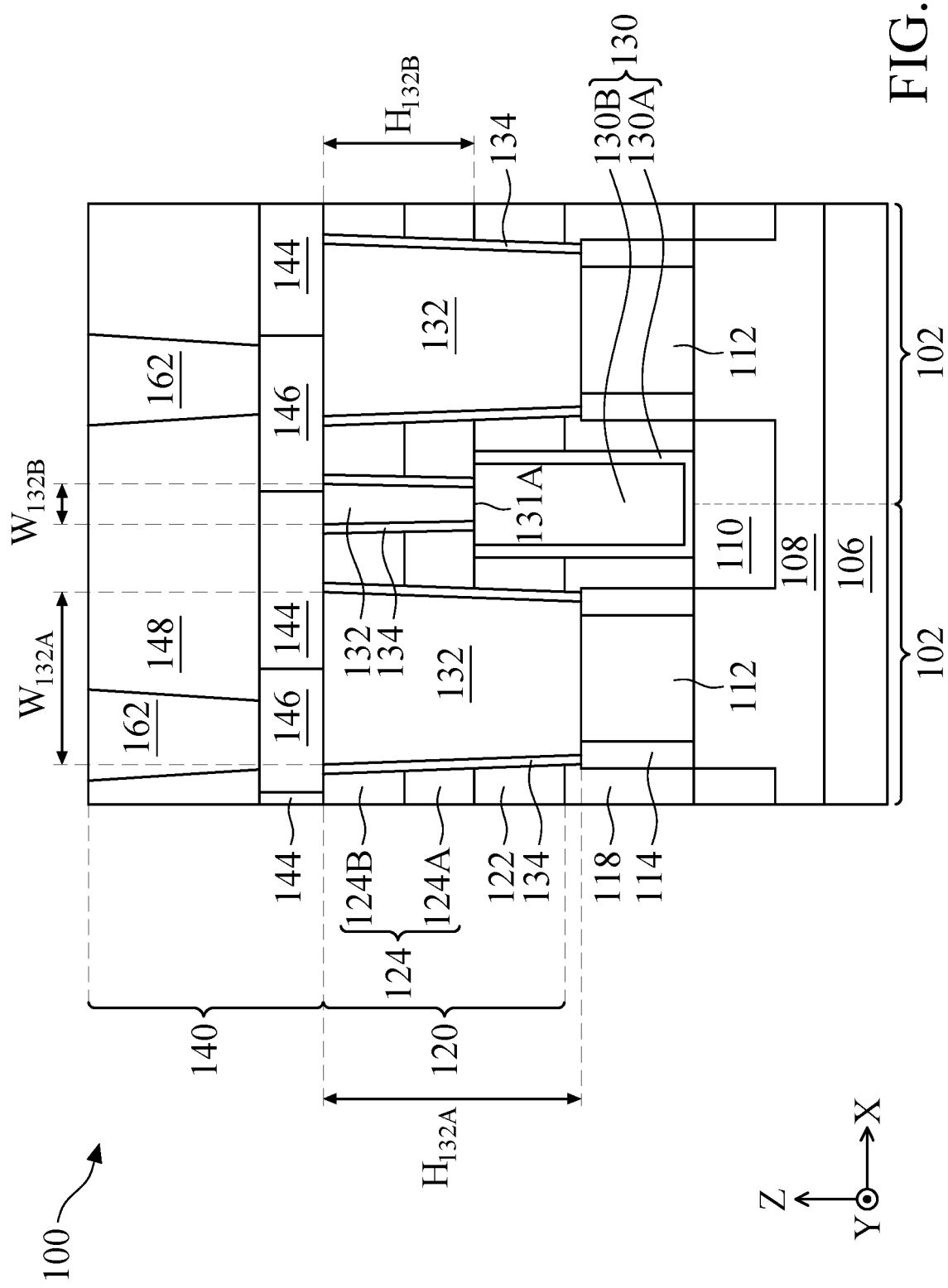
Figure 3B:
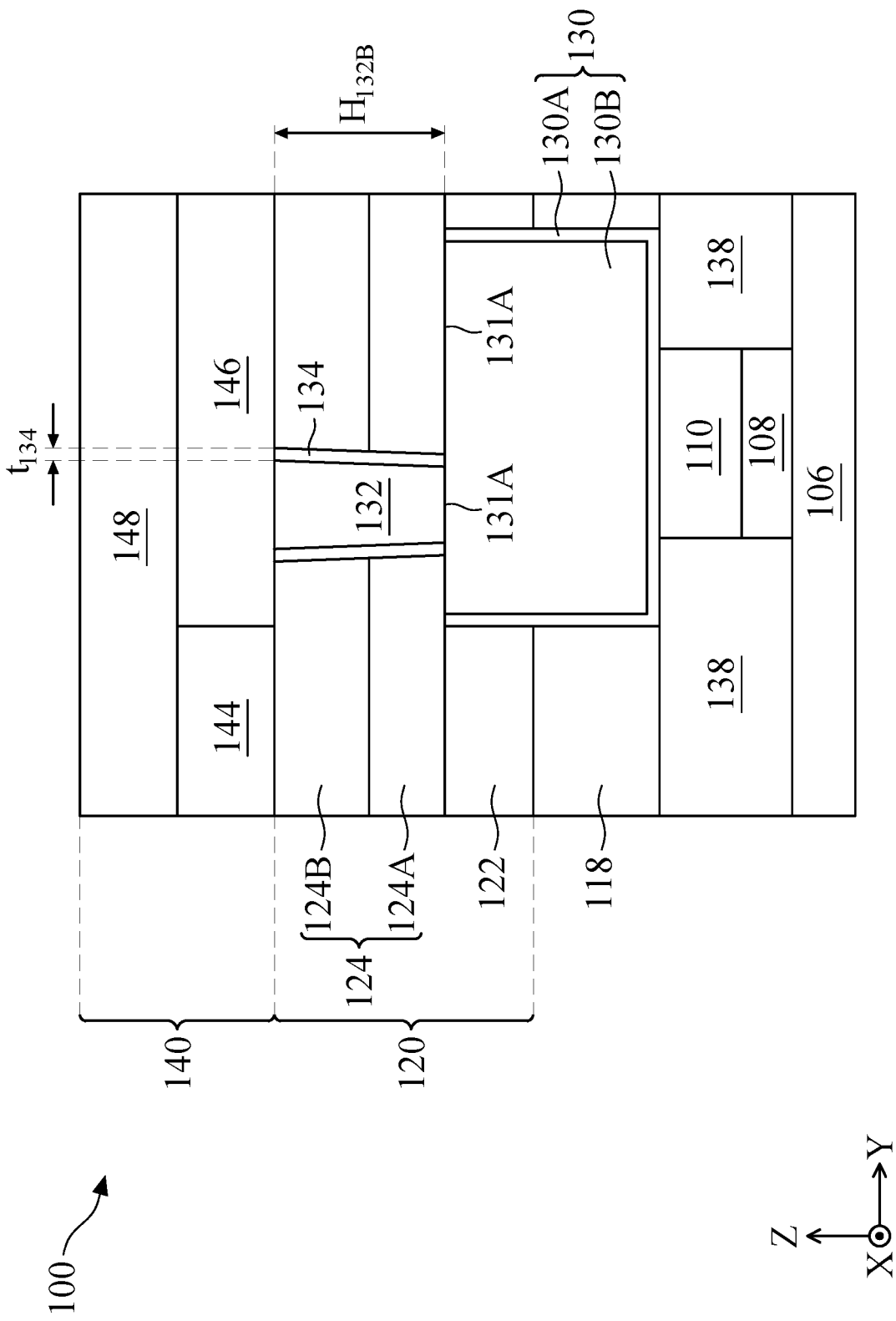

A semiconductor device 100 having multiple field effect transistors (FETs) 102, a contact structure 120 disposed over FETs 102, and an interconnect structure 140 disposed over contact structure 120 is described with reference to FIGS. 1, 2A, 2B, 3A, and 3B, according to some embodiments. FIG. 1 illustrates an isometric view of semiconductor device 100, according to some embodiments. FIGS. 2A and 3A illustrate cross-sectional views along line A-A of semiconductor device 100 of FIG. 1, according to some embodiments. FIGS. 2B and 3B illustrate cross-sectional views along line B-B of semiconductor device 100 of FIG. 1, according to some embodiments. The discussion of elements in FIGS. 1, 2A, 2B, 3A, and 3B with the same annotations applies to each other, unless mentioned otherwise. Semiconductor device 100 can be included in a microprocessor, memory cell, or other integrated circuit. Though FETs 102 shown in FIGS. 1, 2A, 2B, 3A, and 3B are fin field effect transistors (finFETs), each FET 102 can be a gate-all-around (GAA) FET, according to some embodiments.

Referring to FIGS. 1, 2A, and 2B, each FET 102 can include a fin structure 108 extending along an x-direction, a gate structure 112 traversing through fin structure 108 along a y-direction, and a source/drain (S/D) region 110 formed over portions of fin structure 108. Although FIG. 1 shows fin structure 108 accommodating two FETs 102, any number of FETs 102 can be disposed along fin structure 108. Each FET 102 can be formed on a substrate 106. Substrate 106 can be a semiconductor material, such as silicon. In some embodiments, substrate 106 can include (i) an elementary semiconductor, such as silicon (Si) and germanium (Ge); (ii) a compound semiconductor including silicon carbide (SiC), gallium arsenide (GaAs), gallium phosphide (GaP), indium phosphide (InP), indium arsenide (InAs), and indium antimonide (InSb); or (iii) a combination thereof. Further, substrate 106 can be doped depending on design requirements (e.g., p-type substrate or n-type substrate). In some embodiments, substrate 106 can be doped with p-type dopants (e.g., boron (B), indium (In), aluminum (Al), or gallium (Ga)) or n-type dopants (e.g., phosphorus (P) or arsenic (As)).

Fin structure 108 can be formed over substrate 106. Fin structure 108 can extend along an x-axis and traversed by gate structure 112 along a y-axis. In some embodiments, portions of fin structure 108 that is traversed by gate structure 112 can be FET 102's channel region. Fin structure 108 can include a material identical to or similar to substrate 106, such as a material having a lattice constant substantially close to (e.g., lattice mismatch within 5%) that of substrate 106. In some embodiments, fin structure 108 and substrate 106 can be made of Si. In some embodiments, fin structure 108 can be made of multiple layers of silicon germanium (SiGe).

S/D region 110 can be formed over fin structure 108. S/D region 110 can include an epitaxially-grown semiconductor material. In some embodiments, the epitaxially-grown semiconductor material can be the same material as the material of substrate 106. For example, the epitaxially-grown semiconductor material can have a lattice constant substantially close to (e.g., lattice mismatch within 5%) that of the material of substrate 106. In some embodiments, the epitaxially-grown semiconductor material can include: (i) a semiconductor material, such as Ge and Si; (ii) a compound semiconductor material, such as GaAs and AlGaAs; or (iii) a semiconductor alloy, such as SiGe and GaAsP. S/D region 110 can be doped with p-type dopants or doped with n-type dopants. The p-type dopants can include B, In, Al, or Ga. The n-type dopants can include P or As.

Gate structure 112 can be multi-layered structures that wraps around portions of fin structure 108. For example, gate structure 112 can wrap FET 102's channel region (e.g., portions of fin structure 108 wrapped by gate structure 112) to modulate a conductivity of FET 102's channel region. In some embodiments, gate structure 112 can be referred to as gate-all-around (GAA) structures, where FET 102 can be referred to as a GAA FET 102. Gate structure 112 can have a suitable length $L_{112}$, such as from about 10 nm to about 100 nm, to meet a gate pitch requirement associated with an IC's technology node (e.g., 7 nm node, 5 nm node, 3 nm node, etc.).

Gate structure 112 can include a gate dielectric layer (not shown in FIGS. 1, 2A, and 2B), a gate electrode (not shown in FIGS. 1, 2A, and 2B) disposed on the gate dielectric layer, and a gate spacer 114 disposed on sidewalls of the gate electrode. The gate dielectric layer can be wrapped around fin structure 108, hence electrically isolating fin structure 108 from the gate electrode. The gate dielectric layer can be disposed between the gate electrode and S/D regions 110 to prevent electrical shorting in between. The gate dielectric layer can include any suitable dielectric material, such as silicon oxide, silicon nitride, silicon oxynitride, and a high-k dielectric material that has a dielectric constant greater than the dielectric constant of silicon dioxide (e.g., greater than about 3.9), such as aluminum oxide and hafnium oxide ($HfO_2$). The gate dielectric layer can have a thickness ranging from about 1 nm to about 5 nm. Based on the disclosure herein, other materials and thicknesses for the gate dielectric layers are within the spirit and scope of this disclosure.

Gate structure 112 can further include a gate electrode (not shown in FIGS. 1, 2A, and 2B) disposed on the gate dielectric layer. The gate electrode can be a gate terminal of FET 102. The gate electrode can include metal stacks that wrap about fin structure 108. In some embodiments, the gate electrode can include titanium (Ti), tantalum (Ta), aluminum (Al), copper (Cu), tungsten (W), manganese (Mn), zirconium (Zr), ruthenium (Ru), molybdenum (Mo), cobalt (Co), nickel (Ni), silver (Ag), nickel silicide (NiSi), cobalt silicide (CoSi), titanium nitride (TiN), tantalum nitride (TaN), tantalum silicon nitride (TaSiN), tantalum carbon nitride (TaCN), titanium aluminum (TiAl), titanium aluminum nitride (TiAlN), tungsten nitride (WN), tungsten nitride (WN), tantalum carbide (TaC), titanium carbide (TiC), titanium aluminum carbide (TiAlC), or tantalum aluminum carbide (TaAlC). Based on the disclosure herein, other materials for the gate electrode are within the spirit and scope of this disclosure.

Gate structure 112 can further include a gate spacer 114 disposed on sidewalls of the gate electrode. Gate spacer 114 can physically contact the gate dielectric layers. Gate spacer 114 can include a low-k material with a dielectric constant less than about 3.9. For example, gate spacer 114 can include insulating material, such as silicon oxide, silicon nitride, a low-k material, and a combination thereof. In some embodiments, gate spacer 114 can have a thickness $t_{114}$ ranging from about 2 nm to about 10 nm. Based on the disclosure herein, other materials and thicknesses for gate spacer 114 are within the spirit and scope of this disclosure.

Semiconductor device 100 can further include a shallow trench isolation (STI) regions 138 that provide electrical isolation for fin structure 108. For example, STI regions 138 can electrically isolate fin structure 108 from another fin structure 108 (not shown in FIG. 1) formed in semiconductor device 100. Also, STI regions 138 can provide electrical isolation between FETs 102 and neighboring active and passive elements (not shown in FIG. 1) integrated with or deposited on substrate 106. STI regions 138 can include one or more layers of dielectric material, such as a nitride layer, an oxide layer disposed on the nitride layer, and an insulating layer disposed on the nitride layer. In some embodiments, an insulating layer can refer to a layer that functions as an electrical insulator (e.g., a dielectric layer). In some embodiments, the insulating layer can include silicon oxide, silicon nitride, silicon oxynitride, fluorine-doped silicate glass (FSG), a low-k dielectric material, and/or other suitable insulating materials. Based on the disclosure herein, other materials for STI region 138 are within the spirit and scope of this disclosure.

Semiconductor device 100 can further include an interlayer dielectric (ILD) layer 118 disposed over fin structure 108 to provide an electrical insulation between adjacent fin structures 108. In some embodiments, ILD layer 118 can provide an electrical insulation between S/D region 110 and contact structure 120. By way of example and not limitation, ILD layer 118 can include a dielectric material deposited using a deposition method suitable for flowable dielectric materials (e.g., flowable silicon oxide, flowable silicon nitride, flowable silicon oxynitride, flowable silicon carbide, or flowable silicon oxycarbide). In some embodiments, the dielectric material can be silicon oxide or silicon nitride. In some embodiments, ILD layer 118 can have a thickness from about 50 nm to about 200 nm. Based on the disclosure herein, other materials, thicknesses, and formation methods for ILD layer 118 are within the spirit and scope of this disclosure.

Referring to FIGS. 1, 2A and 2B, contact structure 120 can be between FET 102 and interconnect structure 140 to electrically connect FET 102 to interconnect structure 140. Contact structure 120 can include an ILD layer 122 disposed over ILD layer 118 and over gate structure 112. In some embodiments, ILD layer 122 can include multiple layers of dielectric material (not shown in FIGS. 2A and 2B) with different etching selectivity from each other. In some embodiments, the term "etching selectivity" can refer to the ratio of the etch rates of two materials under the same etching conditions. ILD layer 122 can be made of any suitable insulating material, such as silicon nitride, silicon oxynitride, and silicon oxide. ILD layer 122 can have any suitable thickness, such as from about 50 nm to about 200 nm. Other materials and thicknesses for ILD layer 122 are within the spirit and scope of this disclosure.

Contact structure 120 can further include a trench conductor layers 130 vertically (e.g., in the z-direction) extending through ILD layer 122 and ILD layer 118 to contact S/D region 110. In some embodiments, trench conductor layers 130 can represent FET 102's S/D contact structure that contacts FET 102's S/D regions 110. Trench conductor layer 130 can include a layer of metallic material 130B made of a metallic material and/or a silicide material. In some embodiments, layer of metallic material 130B can be made of Co, W, Al, Cu, Ti, Ta, Ru, Mo, or a silicide material. In some embodiments, layer of metallic material 130B can be in contact with S/D region 110 and/or ILD layer 122 (not shown in FIGS. 2A and 2B). In some embodiments, trench conductor layer 130 can further include a barrier liner 130A formed between ILD layer 122 and layer of metallic material 130B. Barrier liner 130A can be adhesion promoter to adhere layer of metallic material 130B to ILD layer 122. In some embodiments, barrier liner 130A can be made of a conductive nitride material, such as TiN and TaN. Based on the disclosure herein, other materials for trench conductor layer 130 are within the spirit and scope of this disclosure.

Trench conductor layer 130 can have a suitable average vertical dimension (e.g., height in the z-direction) based on a pitch size of FET 102. For example, trench conductor layer 130 can have an average vertical dimension (e.g., height in the z-direction) from about 100 nm to about 600 nm. Trench conductor layer 130's top surface can further have a suitable average horizontal (e.g., in the x-direction) width $W_{130}$ based on a pitch size of FET 102. For example, trench conductor layer 130's top surface's width $W_{130}$ can be from about 15 nm to about 50 nm. In some embodiments, trench conductor layer 130 can include slanted sidewalls, such that trench conductor layer 130's top surface width $W_{130}$ can be greater than trench conductor layer 130's bottom surface's horizontal dimension (e.g., width in the x-direction). In some embodiments, trench conductor layer 130 can have an aspect ratio (e.g., a ratio of height in the z-direction to width $W_{130}$ in the x-direction) greater than about 1, greater than about 3, or greater than about 5 based on a pitch size of FET 102. Based on the disclosure herein, other dimensions for trench conductor layer 130 are within the spirit and scope of this disclosure.

Referring to FIGS. 2A, 2B, 3A, and 3B, trench conductor layer 130's top surface can have a top surface portion 131A substantially coplanar with ILD layer 122. In some embodiments, trench conductor layer 130's top surface can have another top surface portion 131B (shown in FIGS. 2A and 2B) that is closer to S/D region 110 than top surface portion 131A. In some embodiments, top surface portion 131B of trench conductor layer 130's top surface can be a warped surface extending towards S/D region 110. In some embodiments, as shown in FIG. 2A, top surface portion 131B's two opposite (e.g., in the x-direction) sides can be in contact with ILD layer 122's top surface. In some embodiments, as shown in FIG. 2B, top surface portion 131B's two opposite (e.g., in the y-direction) sides can be in contact top surface portion 131A.

Referring to FIGS. 2A and 2B, contact structure 120 can further include a layer of dielectric material 124 disposed over trench conductor layer 130 and ILD layer 122. In some embodiments, layer of dielectric material 124 can include an etch stop layer (ESL) 124A and a layer of dielectric material 124B that can have different etching selectivity from ESL 124A. Layer of dielectric material 124 (e.g., each of ESL 124A and layer of dielectric material 124B) can be made of any suitable insulating material, such as silicon oxide, silicon nitride, silicon oxynitride, and a metal-based oxide material (e.g., aluminum oxide). Layer of dielectric material 124 can have a suitable thickness $t_{124}$ (shown in FIGS. 6A and 6B), such as from about 50 nm to about 200 nm. Based on the disclosure herein, other materials and thicknesses for layer of dielectric material 124 are within the spirit and scope of this disclosure.

Contact structure 120 can further include multiple trench conductor layers 132 to electrically bridge interconnect structure 140 with the underlying trench conductor layer 130 and gate structure 112. For example, trench conductor layer 132 can have a top surface substantially coplanar with layer of dielectric material 124, and trench conductor layer 132 can further have a bottom surface in contact with gate structure 112 and/or trench conductor layer 130. Trench conductor layer 132 can be made of any suitable conductive materials, such as a platinum-group metallic material, Mo, W, Al, Cu, Co, Ta, a silicide material, and a conductive nitride material. In some embodiments, trench conductor layer 132 can be made of a single layer of metallic material. For example, trench conductor layer 132 can be a single layer of Ru, such that each portion (e.g., proximate to top surface, side surfaces, and bottom surface) of trench conductor layer 132 is made of Ru. In some embodiments, trench conductor layer 132 can be a liner-less (e.g., indentation-free) structure that can provide an increased effective contact area to reduce the resistance for trench conductor layer 132. With trench conductor layer 132 being a liner-less structure, trench conductor layer 132's top surface and bottom surface can connect trench conductor layer 132's two opposite side surfaces. In some embodiments, trench conductor layer 132 can be made of multiple layers of metallic material, where each of the multiple layers of metallic material can be a liner-less structure.

In some embodiments, trench conductor layer 132 can vertically (e.g., in the z-direction) extend through layer of dielectric material 124, ILD layer 122 and/or ILD layer 118 to contact the underlying gate structure 112. As shown in FIG. 2A, trench conductor layer 132 that is in contact with gate structure 112 can have a suitable height $H_{132A}$ (e.g., in the z-direction), such as from about 25 nm to about 60 nm, and a top surface with a suitable width $W_{132A}$ (e.g., in the x-direction), such as from about 6 nm to about 20 nm. In some embodiments, a ratio of height $H_{132A}$ to width $W_{132A}$ can be from about 1.3 to about 10. If the ratio of height $H_{132A}$ to width $W_{132A}$ is less than the above-noted lower limit, a higher parasitic capacitance may be induced between interconnect structure 140 and gate structure 112, thus degrading FET 102's speed. If the ratio of height $H_{132A}$ to width $W_{132A}$ is greater than the above-noted upper limit, trench conductor layer 132 may incorporate void structures therein, thus degrading semiconductor device 100's reliability.

In some embodiments, referring to FIGS. 2A, 2B, 3A, and 3B, trench conductor layer 132 can vertically (e.g., in the z-direction) extend through layer of dielectric material 124 to contact the underlying trench conductor layer 130. Trench conductor layer 132 that is in contact with trench conductor layer 130 can have a suitable height $H_{132B}$ (e.g., in the z-direction), such as from about 15 nm to about 50 nm. In some embodiments, as shown in FIGS. 2A and 2B, trench conductor layer 132 can contact top surface portion 131B of trench conductor layer 130's top surface, such that height $H_{132B}$ can be greater than dielectric layer 124's thickness $t_{124}$. In some embodiments, trench conductor layer 132 that contacts top surface portion 131B of trench conductor layer 130's top surface can be further in contact with layer of dielectric material 124's bottom surface. In some embodiments, as shown in FIGS. 3A and 3B, trench conductor layer 132 can contact top surface portion 131A of trench conductor layer 130's top surface, such that height $H_{132B}$ can be substantially equal to dielectric layer 124's thickness $t_{124}$. Trench conductor layer 132 that is in contact with trench conductor layer 130 can further have a top surface with a suitable width $W_{132B}$ (e.g., in the x-direction), such as from about 5 nm to about 20 nm. In some embodiments, as shown in FIGS. 2A and 2B, an upper portion of trench conductor layers 132 can have a width substantially equal to width $W_{132B}$, and a lower portion of trench conductor layer 132 that contact top surface portion 131B can have another width greater than width $W_{132B}$. In some embodiments, as shown in FIGS. 3A and 3B, an upper portion of trench conductor layers 132 can have a width substantially equal to width $W_{132B}$, and a lower portion of trench conductor layer 132 that contact top surface portion 131A can have another width substantially equal to width $W_{132B}$. In some embodiments, a ratio of height $H_{132B}$ to width $W_{132B}$ can be from about 0.8 to about 10. If the ratio of height $H_{132B}$ to width $W_{132B}$ is less than the above-noted lower limit, a higher capacitance may be induced between interconnect structure 140 and trench conductor layer 130, thus degrading FET 102's speed. If the ratio of height $H_{132B}$ to width $W_{132B}$ is greater than the above-noted upper limit, trench conductor layer 132 may incorporate void structures therein, thus degrading semiconductor device 100's reliability. In some embodiments, trench conductor layer 132 can be concurrently in contact with trench conductor layer 130 and gate structure 112 (this embodiment is not shown in FIGS. 2A, 2B, 3A, and 3B).

Referring to FIGS. 2A, 2B, 3A, and 3B, contact structure 120 can further include a nucleation layer 134 disposed over trench conductor layer 132's side surfaces. Nucleation layer 134 can be positioned between layer of dielectric material 124 and trench conductor layer 132 to ensure a conformal deposition rate to deposit a conductive material to form a seamless and void-free trench conductor layer 132 (discussed at method 400). In some embodiments, nucleation layer 134 can be in contact with ILD layer 122. In some embodiments, nucleation layer 134 can be in contact with gate structure 112 and/or ILD layer 118. In some embodiments, as shown in FIGS. 3A and 3B, nucleation layer 134 can be in contact with top surface portion 131A of trench conductor layer 130's top surface. In some embodiments, as shown in FIGS. 2A and 2B, nucleation layer 134 can be in contact with edge portions (e.g., proximate to ILD layer 122 and/or proximate to top surface portion 131A) of top surface portion 131B, and nucleation layer 134 can be separated from a central portion (e.g., proximate to trench conductor layer 132's bottommost vertex) of top surface portion 131B. In some embodiments, nucleation layer 134 can be further in contact with layer of dielectric layer 122 (shown in FIG. 2A) and/or layer of dielectric material 124's bottom surface (shown in FIG. 2B).

Nucleation layer 134 can have a thickness $t_{134}$ from about 0.1 nm to about 0.6 nm. If thickness $t_{134}$ is less than the above-noted lower limit, nucleation layer 134 may not have sufficient thickness to provide a conformal deposition rate for the deposition process to deposit a conductive material to form a seamless and void-free trench conductor layer 132. If thickness $t_{134}$ is greater than the above-noted lower limit, trench conductor layer 132's effective contact area may be reduced, thus increasing trench conductor layer 132's resistance. In some embodiments, a ratio of thickness $t_{134}$ to width $W_{132A}$ can be from about 0.005 to about 0.1. If the ratio of thickness $t_{134}$ to width $W_{132A}$ is less than the above-noted lower limit, nucleation layer 134 may not have sufficient thickness to provide a conformal deposition rate for the deposition process to deposit a conductive material to form a seamless and void-free trench conductor layer 132. If the ratio of thickness $t_{134}$ to width $W_{132A}$ is greater than the above-noted upper limit, trench conductor layer 132's effective contact area may be reduced, thus increasing the resistance between interconnect structure 140 and gate structure 112. In some embodiments, a ratio of thickness $t_{134}$ to width $W_{132B}$ can be from about 0.005 to about 0.12. If the ratio of thickness $t_{134}$ to width $W_{132B}$ is less than the above-noted lower limit, nucleation layer 134 may not have sufficient thickness to provide a conformal deposition rate for the deposition process to deposit a conductive material to form a seamless and void-free trench conductor layer 132. If the ratio of thickness $t_{134}$ to width $W_{132B}$ is greater than the above-noted upper limit, trench conductor layer 132's effective contact area may be reduced, thus increasing the resistance between interconnect structure 140 and S/D region 110.

In some embodiments, nucleation layer 134 can be a layer of metal oxide, such as a layer of aluminum oxide, a layer of hafnium oxide, and a layer of titanium oxide. In some embodiments, nucleation layer 134 can be a layer of organometallic material. For example, nucleation layer 134 can be made of organoaluminum. In some embodiments, nucleation layer 134 can be a layer of organometallic material that can include a carbon element and a metallic element, such as Al, Hf, Zr, Ti, Ta, W, Ru, Cu, Mo, Co, a transition metallic element, and a platinum-group metallic element, bonded with the carbon element. In some embodiments, nucleation layer 134 can include a layer of metal oxide proximate to ILD layer 122 and a layer of organometallic material proximate to trench conductor layer 132 (this embodiments is not shown in FIGS. 2A, 2B, 3A, and 3B).

Interconnect structure 140 can provide metal wire routings for the underlying FETs 102. Interconnect structure 140 can include a layer of insulating material 144, a layer of conductive material 146 embedded in layer of insulating material 144, a layer of insulating material 148 disposed over layer of conductive material 146, and a trench conductor layer 162 formed through layer of insulating material 148 and in contact with layer of conductive material 146. Layer of conductive material 146 can be a lateral (e.g., in the x-y plane) routing for the interconnect structure 140. On the contrary, each of trench conductor layers 130 and 132 can be a vertical (e.g., in the z-direction) wire routing for contact structure 120, and trench conductor layer 162 can be a vertical (e.g., in the z-direction) wire routing for the interconnect structure 140. Accordingly, in some embodiments, an aspect ratio (e.g., a ratio of height to width) of layer of conductive material 146 can be less than that of each of trench conductor layers 130 and 132. In some embodiments, a ratio of layer of conductor material 146's aspect ratio to each of trench conductor layers 130 and 132's aspect ratio can be less than about 1, less than about 0.8, less than about 0.6, less than about 0.4, less than about 0.2, or less than about 0.1. If conductor material 146's aspect ratio to each of trench conductor layers 130 and 132's aspect ratio is beyond the above-noted upper limits, interconnect structure 140 may not meet the fin pitch requirement associated with an IC's technology node, thus failing the product requirement of the IC. Layer of conductive material 146 can be disposed over layer of dielectric material 124, trench conductor layer 132, and nucleation layer 134 to electrically connect to the underlying gate structure 112 and S/D regions 110. Trench conductor layer 162 can electrically connect layer of conductive material 146 to another vertically (e.g., in the z-direction) above interconnect structures 140's layer of conductive material 146 (not shown in FIGS. 1, 2A, 2B, 3A, and 3B). Layer of conductive material 146 and trench conductor layer 162 can be made of any suitable conductive material, such as W, Al, Cu, Co, Ti, Ta, Ru, Mo, a silicide material, and a conductive nitride material. Layer of insulating material 148 and layer of insulating material 144 can be made of a suitable dielectric material, such as silicon oxide, silicon nitride, silicon oxynitride, a low-k dielectric, and a high-k dielectric. Based on the disclosure herein, other materials for layer of conductive material 146, trench conductor layer 162, and layer of insulating material 144, and layer of insulating material 148 are within the spirit and scope of this disclosure.

Figure 4:
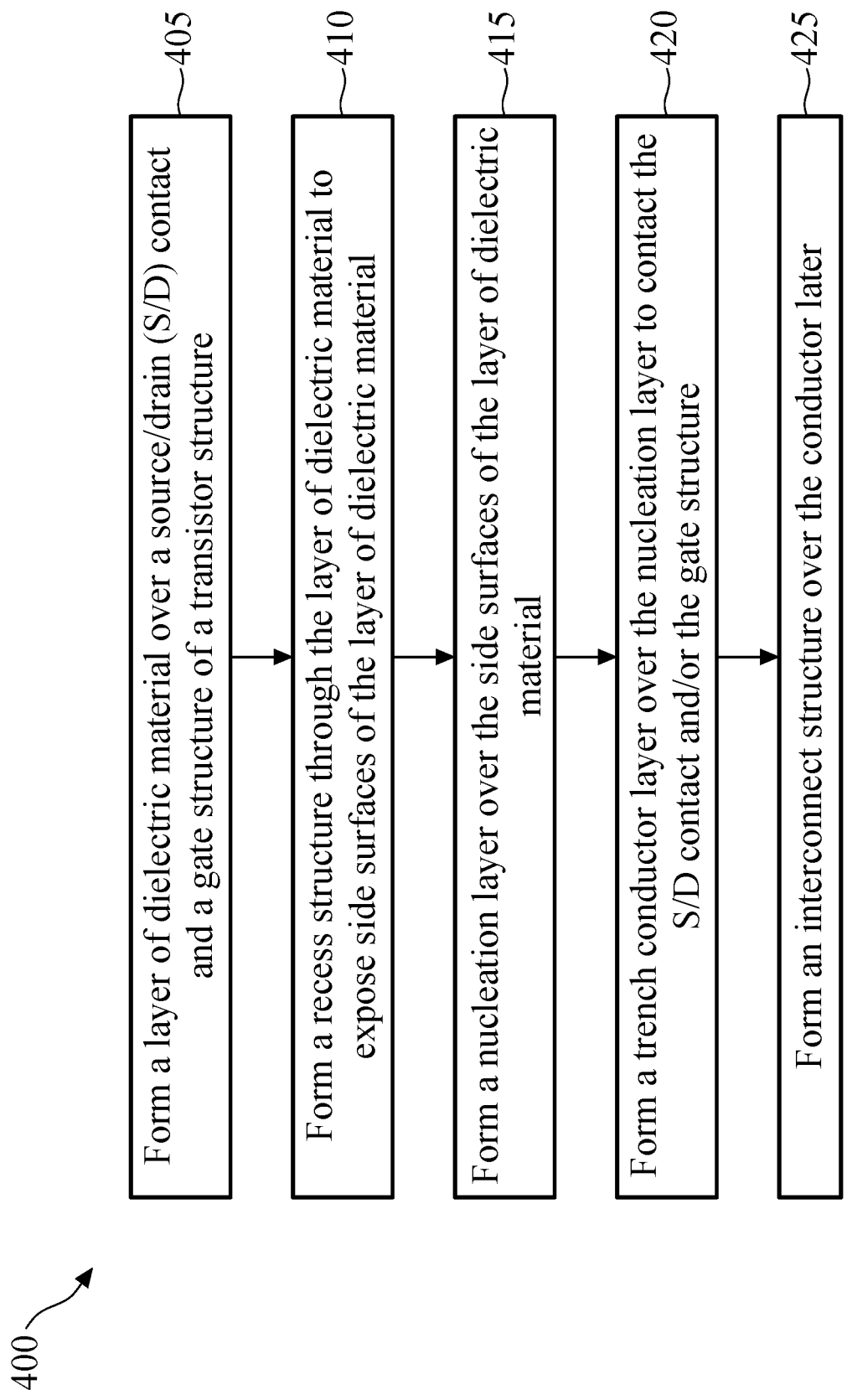
FIG. 4 is a flow diagram of a method for fabricating a semiconductor device, according to some embodiments.

FIG. 4 is a flow diagram of an example method 400 for fabricating semiconductor device 100, according to some embodiments. For illustrative purposes, the operations illustrated in FIG. 4 will be described with reference to FIGS. 5A-14A and 5B-14B. FIGS. 5A-14A are cross-sectional views along line A-A of FIG. 1 at various stages of its fabrication to form semiconductor device 100, according to some embodiments. FIGS. 5B-14B are cross-sectional views along line B-B of FIG. 1 at various stages of its fabrication to form semiconductor device 100, according to some embodiments. Operations can be performed in a different order or not performed depending on specific applications. Method 400 may not produce a complete semiconductor device 100. Accordingly, it is understood that additional processes can be provided before, during, and after method 400, and that some other processes may only be briefly described herein. Further, the discussion of elements in FIGS. 1, 2A-14A, and 2B-14B with the same annotations applies to each other, unless mentioned otherwise.

Referring to FIG. 4, in operation 405, a layer of dielectric material is formed over a source/drain (S/D) contact and a gate structure of a transistor structure. For example, FIGS. 6A and 6B show layer of dielectric material 124 (e.g., ESL 124A and layer of dielectric material 124B) formed over FETs 102's trench conductor layers 130 and gate structure 112 with references to FIGS. 5A, 5B, 6A, and 6B. The process of forming layer of dielectric material 124 can include forming semiconductor device 100 of FIGS. 5A and 5B. In some embodiments, the process of forming semiconductor device 100 of FIGS. 5A and 5B can include providing substrate 106, forming fin structure 108 on substrate 106, forming STI region 138 adjacent to fin structure 108, forming gate structure 112 traversing through fin structure 108, forming S/D regions 110, and forming ILD layer 118 over a portion of fin structure 108 not covered by gate structure 112, and forming ILD layer 122 over gate structure 112 and ILD layer 118. The process of forming semiconductor device 100 of FIGS. 5A and 5B can further include forming trench conductor layers 130 through ILD layer 122 and ILD layer 118 to contact S/D regions 110. Based on the disclosure herein, other formation methods for semiconductor device 100 of FIGS. 5A and 5B are within the spirit and scope of this disclosure.

Figure 5A:
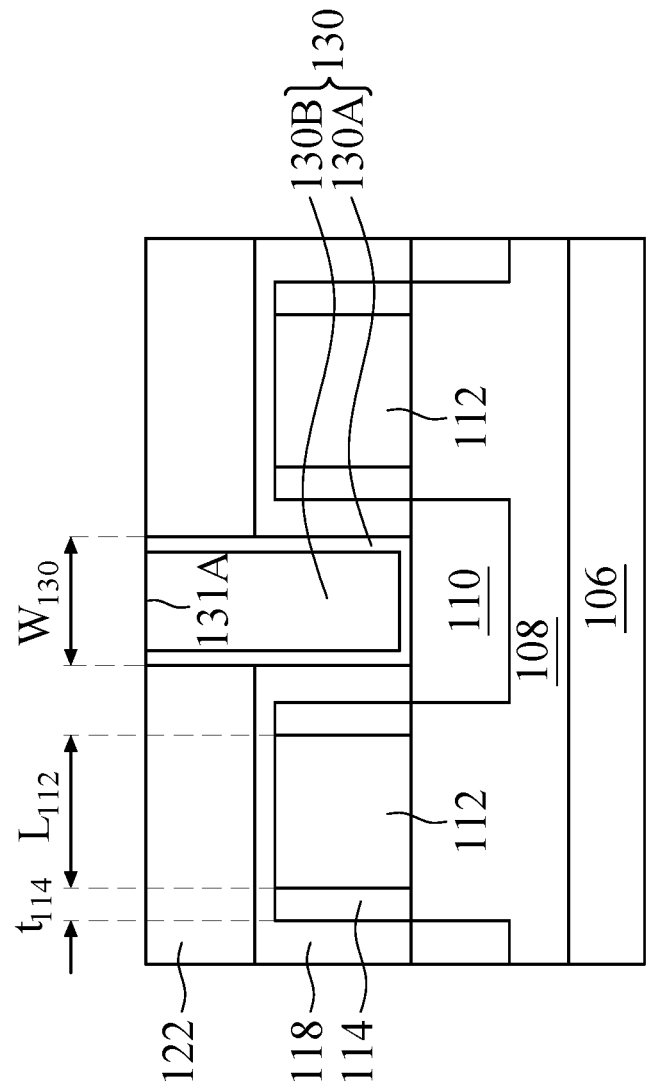
Figure 5B:
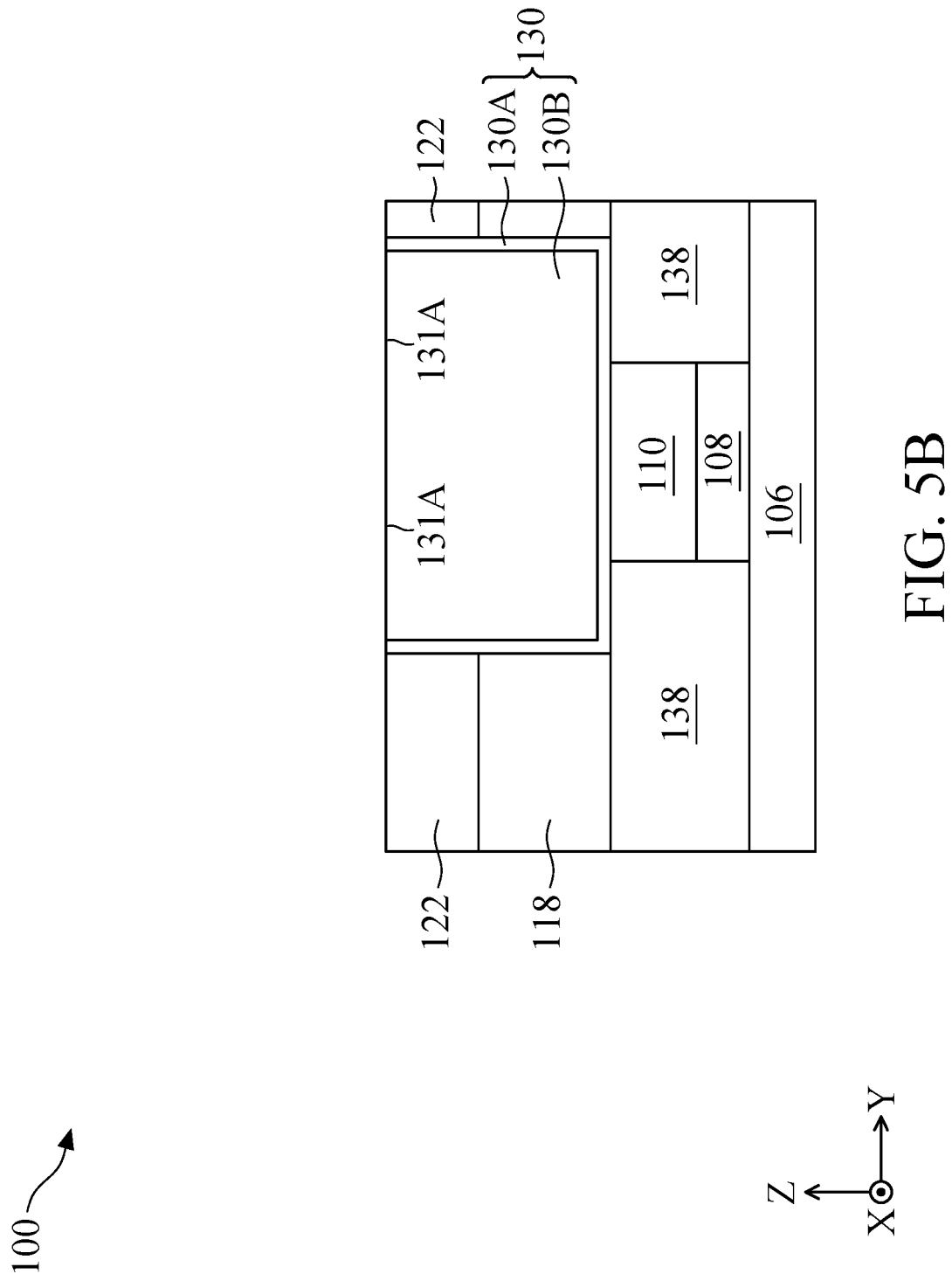
Figure 6A:
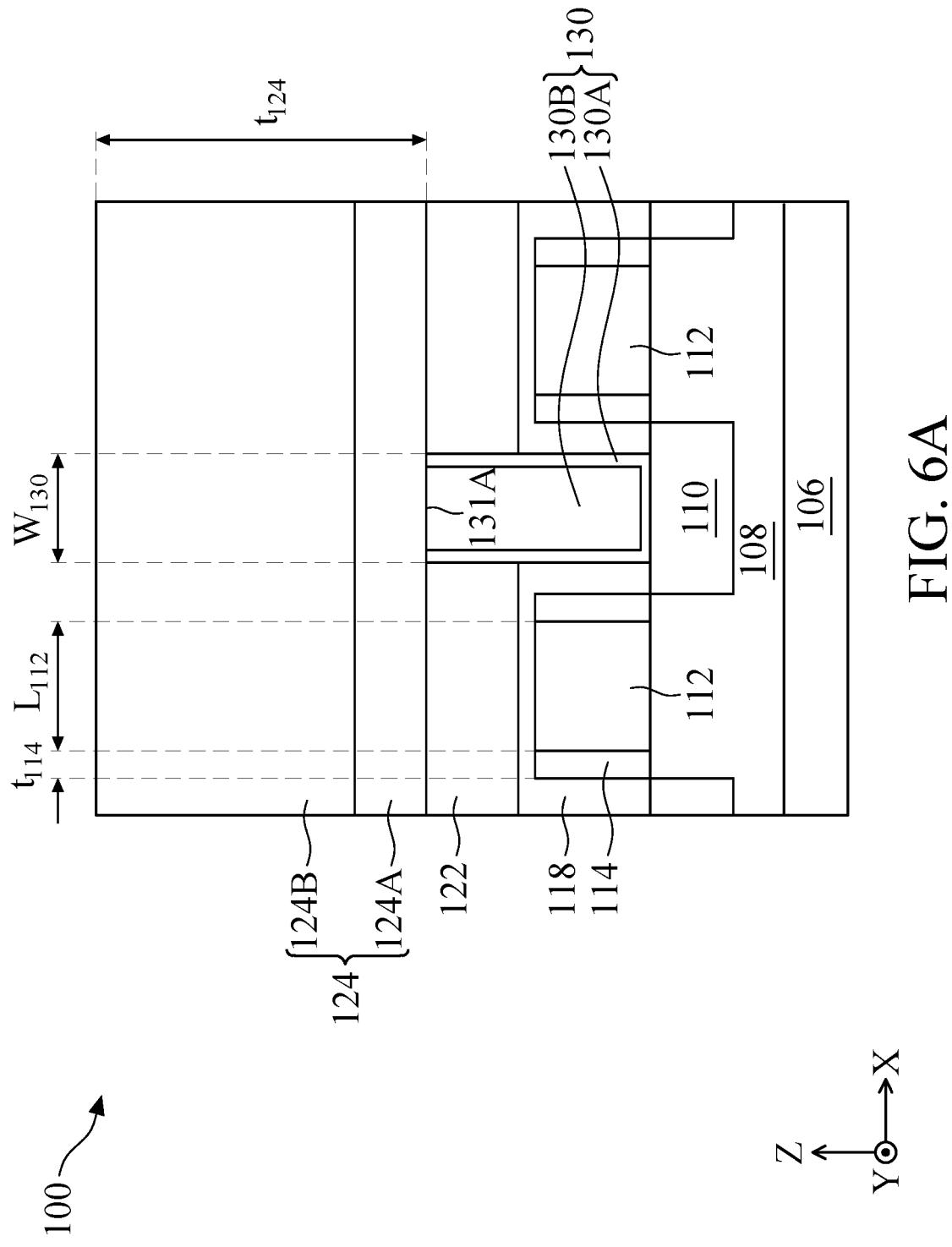
Figure 6B:
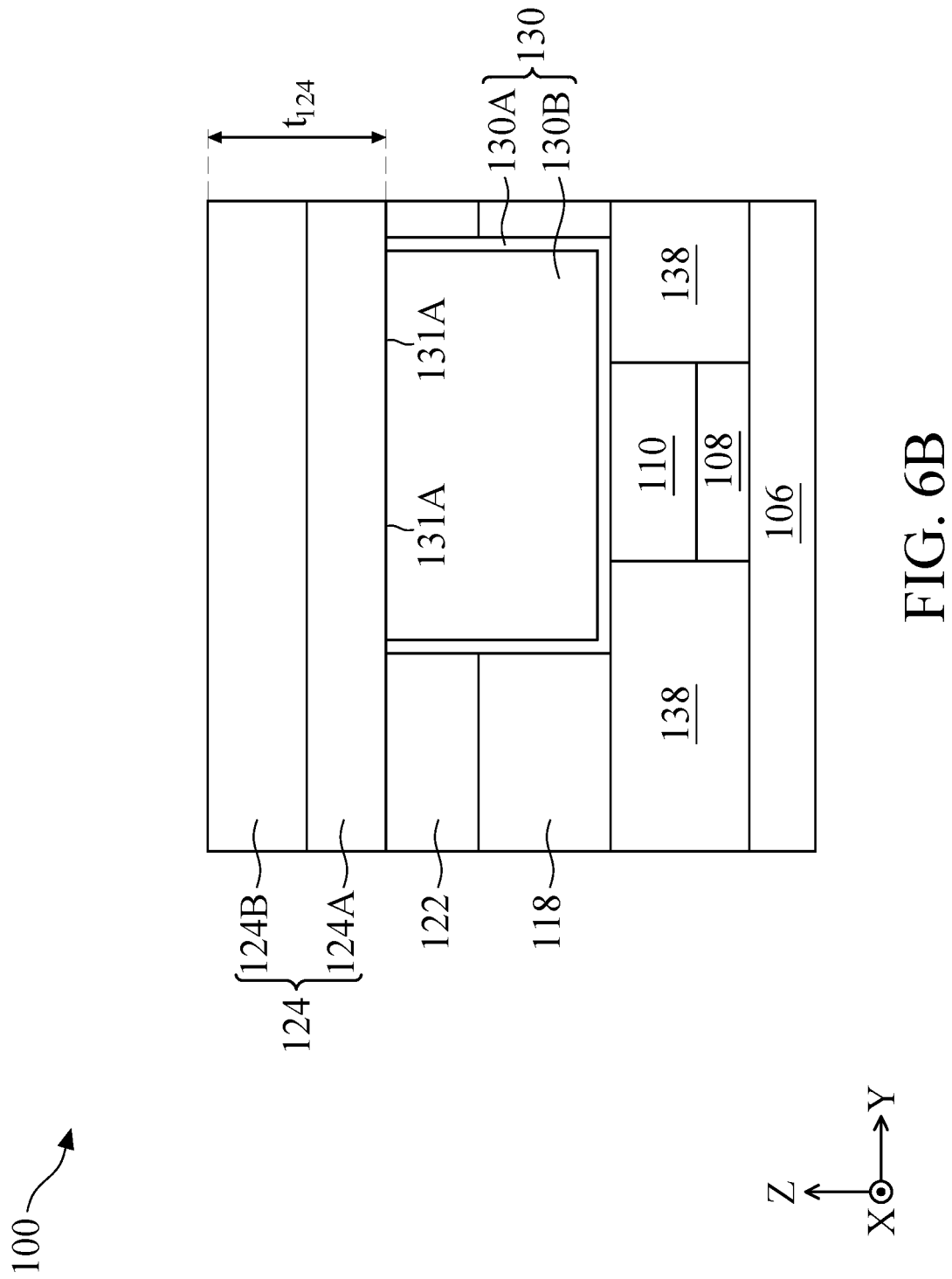

As shown in FIGS. 6A and 6B, the process of forming layer of dielectric material 124 can further include depositing layer of dielectric material 124 with thickness $t_{124}$ over semiconductor device 100 of FIGS. 5A and 5B using any suitable deposition process, such as a CVD process, an atomic layer deposition (ALD) process, a physical vapor deposition (PVD) process, a plasma enhanced CVD (PECVD) process, and a spin-on process. Based on the disclosure herein, other formation methods for layer of dielectric material 124 are within the spirit and scope of this disclosure.

Figure 7A:
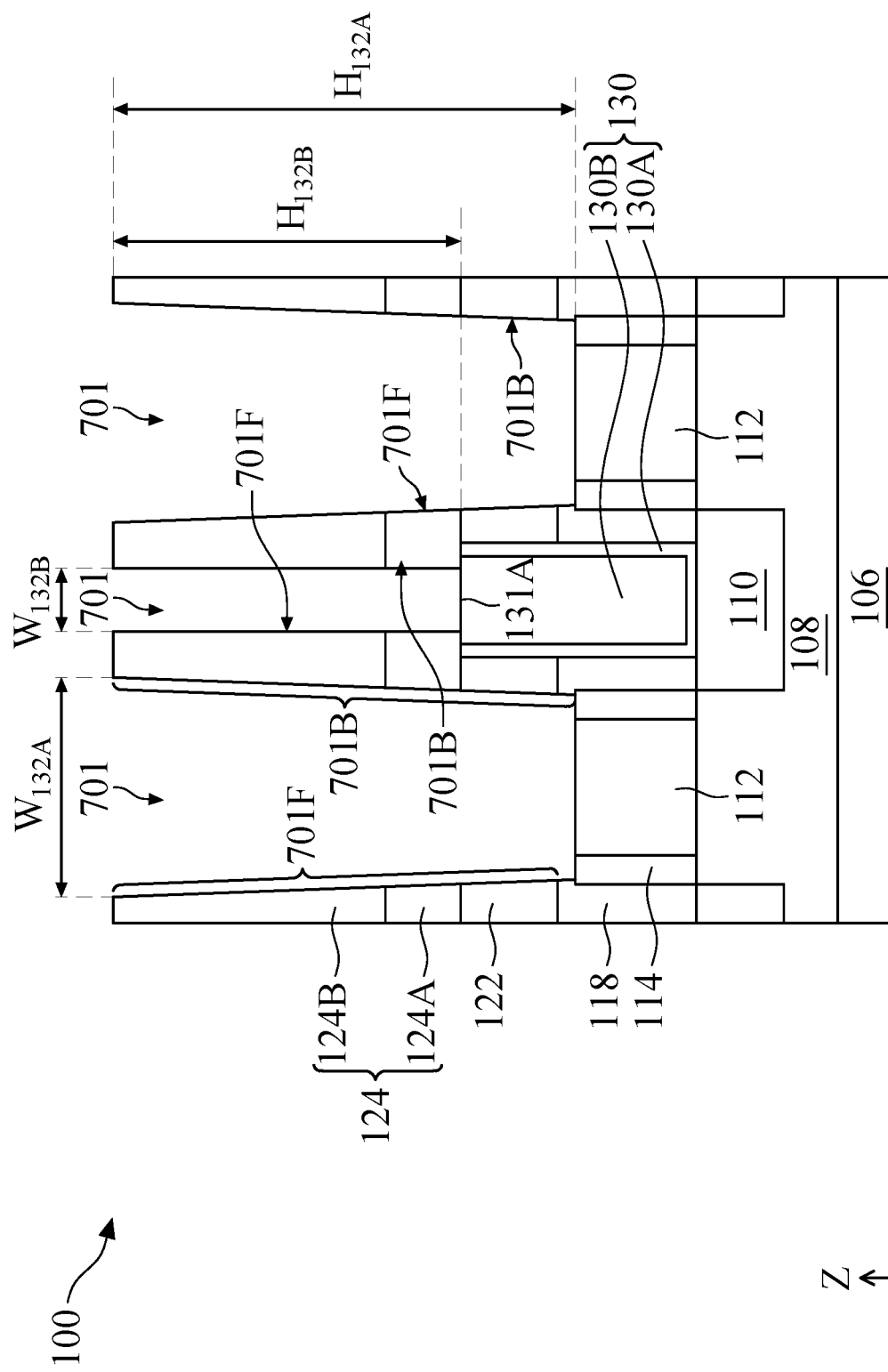
Figure 7B:
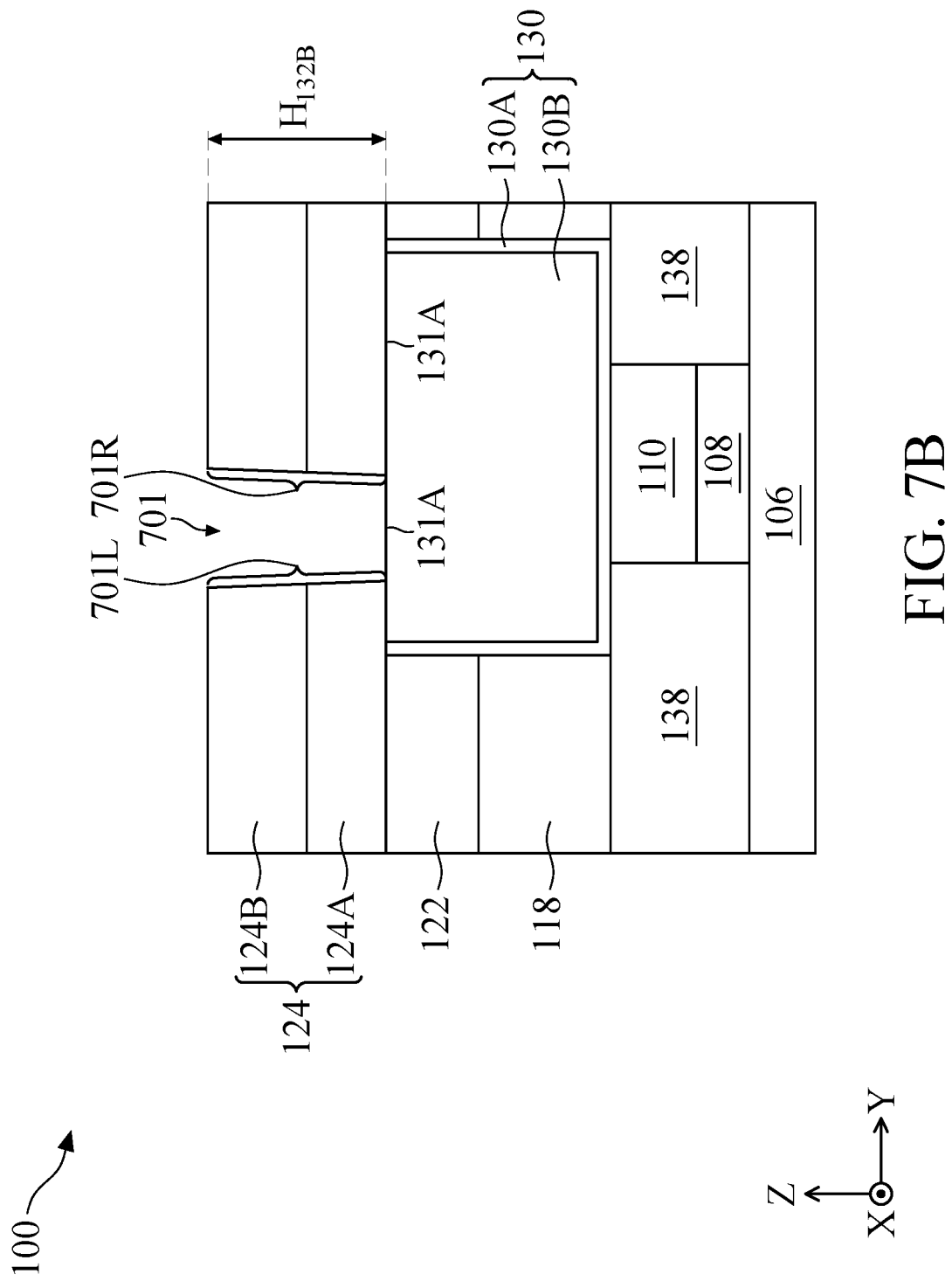

Referring to FIG. 4, in operation 410, a recess structure is formed through the layer of dielectric material to expose side surfaces of the layer of dielectric material. For example, as shown in FIGS. 7A and 7B or FIGS. 8A and 8B, recess structure 701 can be formed through layer of dielectric material 124 to expose side surfaces 701F and 701B (shown in FIG. 7A or FIG. 8A) and side surfaces 701L and 701R (shown in FIG. 7B or FIG. 8B). Referring to FIGS. 7A and 7B, the process forming a recess structure 701 can include (i) forming a mask layer (e.g., a photoresist layer; not shown in FIGS. 7A and 7B) over the structure of FIGS. 6A and 6B, and (ii) patterning, using a lithography process, the mask layer to expose first and second portions of layer of dielectric material 124 that are over trench conductor layer 130 and gate structure 112, respectively; and (iii) performing an etching process to selectively etch layer of dielectric material 124, ILD layer 122, and/or ILD layer 118 over trench conductor layer 130 and gate structure 112 through the patterned mask layer. Accordingly, first and second groups of recess structures 701 can be concurrently formed to expose gate structures 112 and trench conductor layers 130, respectively. The first group of recess structures 701 that expose gate structure 112 can have a top width $W_{132A}$ and height $H_{132A}$. The second group of recess structures 701 that expose trench conductor layer 130's top surface portion 131A can have a top width $W_{132B}$ and height $H_{132B}$. Each of the first and second groups of recess structures 701 can have two opposite side surfaces 701F and 701B in the x-direction and two opposite side surfaces 701L and 701R in the y-direction. Side surfaces 701F, 701B, 701L, and 701R can be made of layer of dielectric material 124's side surfaces, ILD layer 122's side surfaces, and/or ILD layer 118's side surfaces. In some embodiments, the etching process for forming recess structure 701 can include using a plasma dry etch associated with a suitable dry etchant, such as carbon tetrafluoride ($CF_4$), chlorine ($Cl_2$), and hydrogen bromide (HBr), and a wet etching process with a suitable wet etchant (e.g., hydrofluoric acid (HF), an ammonium peroxide mixture (APM), and tetramethylammonium hydroxide (TMAH)). In some embodiments, the structure of FIGS. 7A and 7B can result in semiconductor device 100 of FIGS. 3A and 3B after the fabrication processes of operations 415-425 (discussed below).

Figure 8A:
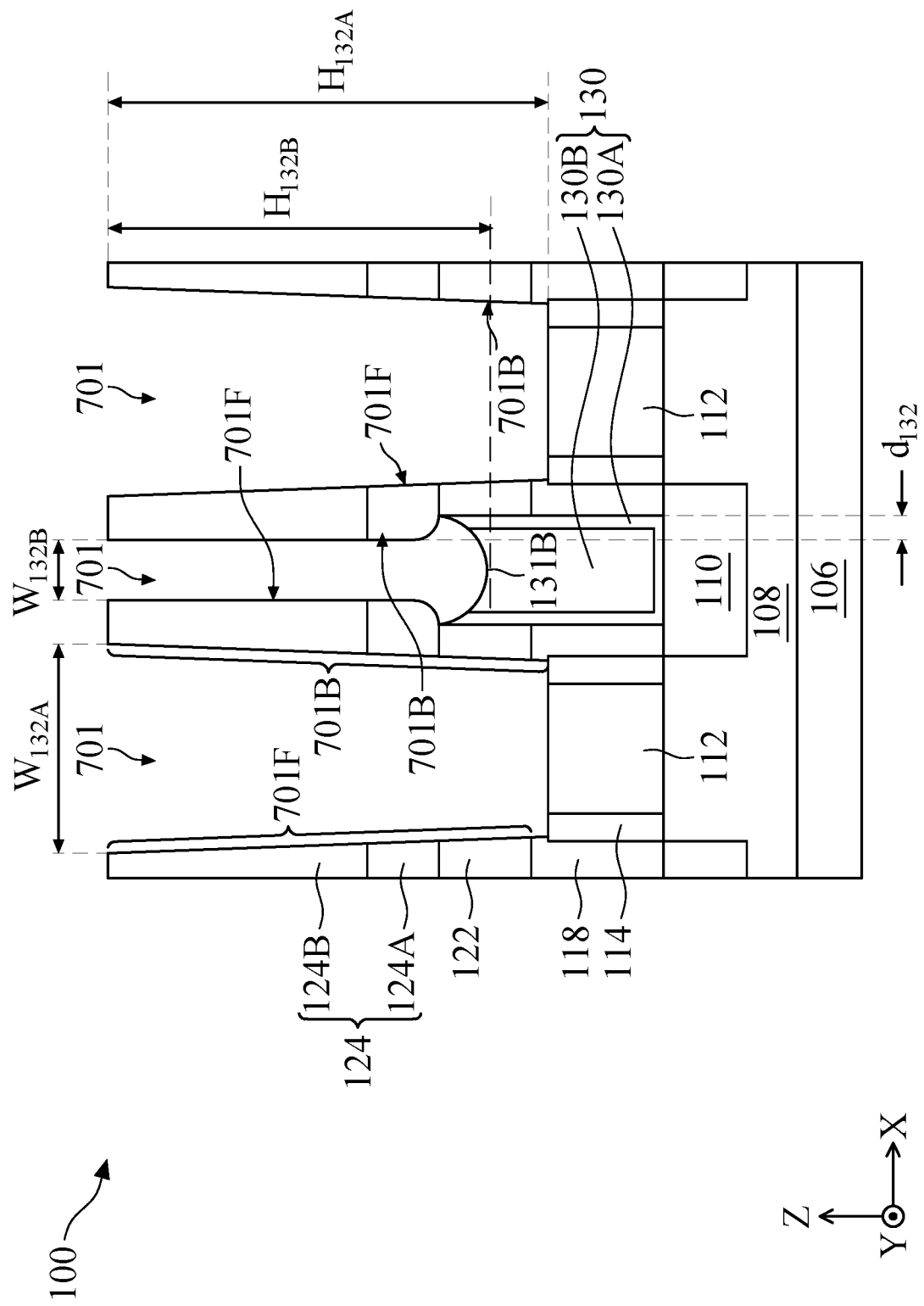
Figure 8B:
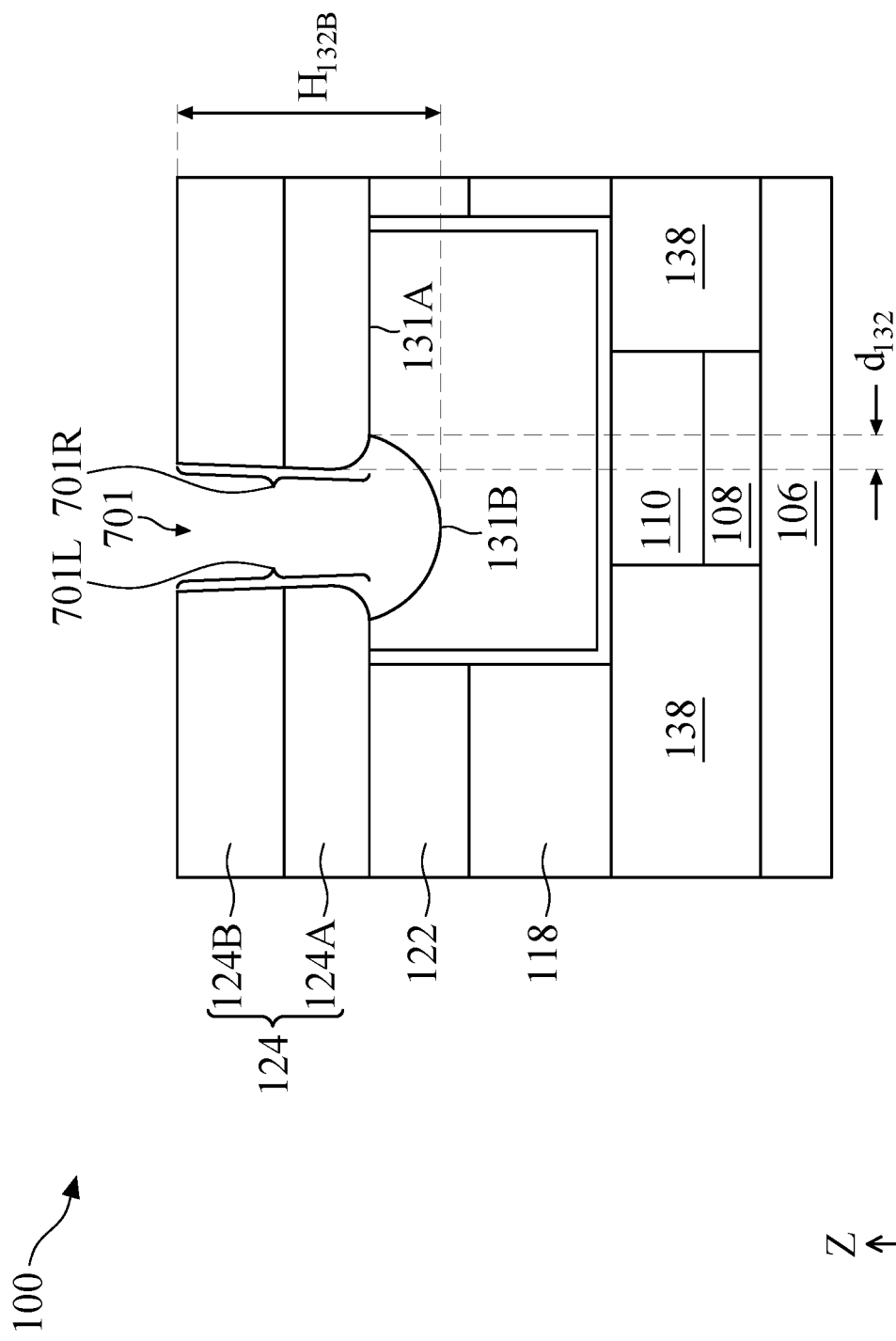

Referring to FIGS. 8A and 8B, in some embodiments, the process of forming recess structure 701 can further include removing a top portion of layer of conductor layer 130, using an etching process, to form a curved trench conductor layer 130's top surface portion 131B. Trench conductor layer 130 with top surface portion 131B can have an increased effective contact area to reduce FET 102's contact resistance. In some embodiments, the curved trench conductor layer 130 top surface portion 131B can have a radius of curvature from about 1 nm to about 25 nm, from about 5 nm to about 25 nm, from about 5 nm to about 15 nm, or from about 1 nm to about 6 nm. If top surface portion 131B's radius of curvature is greater than the above noted upper limits, FET 102's contact resistance may be increased and degrade semiconductor device 100's performance. If top surface portion 131B's radius of curvature is less than the above noted lower limits, trench conductor layer 132 may not be able to completely fill recess structure 701. In some embodiments, recess structure 701 of FIGS. 8A and 8B can expose layer of dielectric material 124's bottom surface with a horizontal (e.g., in the x-direction and/or y-direction) dimension $d_{132}$ from about 1 nm to about 15 nm, from about 5 nm to about 15 nm, from about 5 nm to about 10 nm, or from about 1 nm to about 6 nm. Recess structure 701 with horizontal dimension $d_{132}$ under layer of dielectric material 124 can securely anchor trench conductor layer 132 on trench conductor layer 130, thus improving the contact structure 120's structural integrity. If horizontal dimension $d_{132}$ is less than the above-noted lower limits, recess structure 701 may not anchor trench conductor layer 132 on trench conductor layer 130, thus degrading contact structure 120's structural integrity. If horizontal dimension $d_{132}$ is greater than the above-noted upper limits, trench conductor layer 132 may not be able to completely fill recess structure 701. In some embodiments, the structure of FIGS. 8A and 8B can result in semiconductor device 100 of FIGS. 2A and 2B after the fabrication processes of operations 415-425 (discussed below).

Referring to FIG. 4, in operation 415, a nucleation layer is formed over the side surfaces of the layer of dielectric material. For example, as shown in FIGS. 10A and 10B, nucleation layer 134 can be formed over side surfaces 701F, 701B, 701L, and 701R with references to FIGS. 9A, 9B, 10A, and 10B.

Figure 9A:
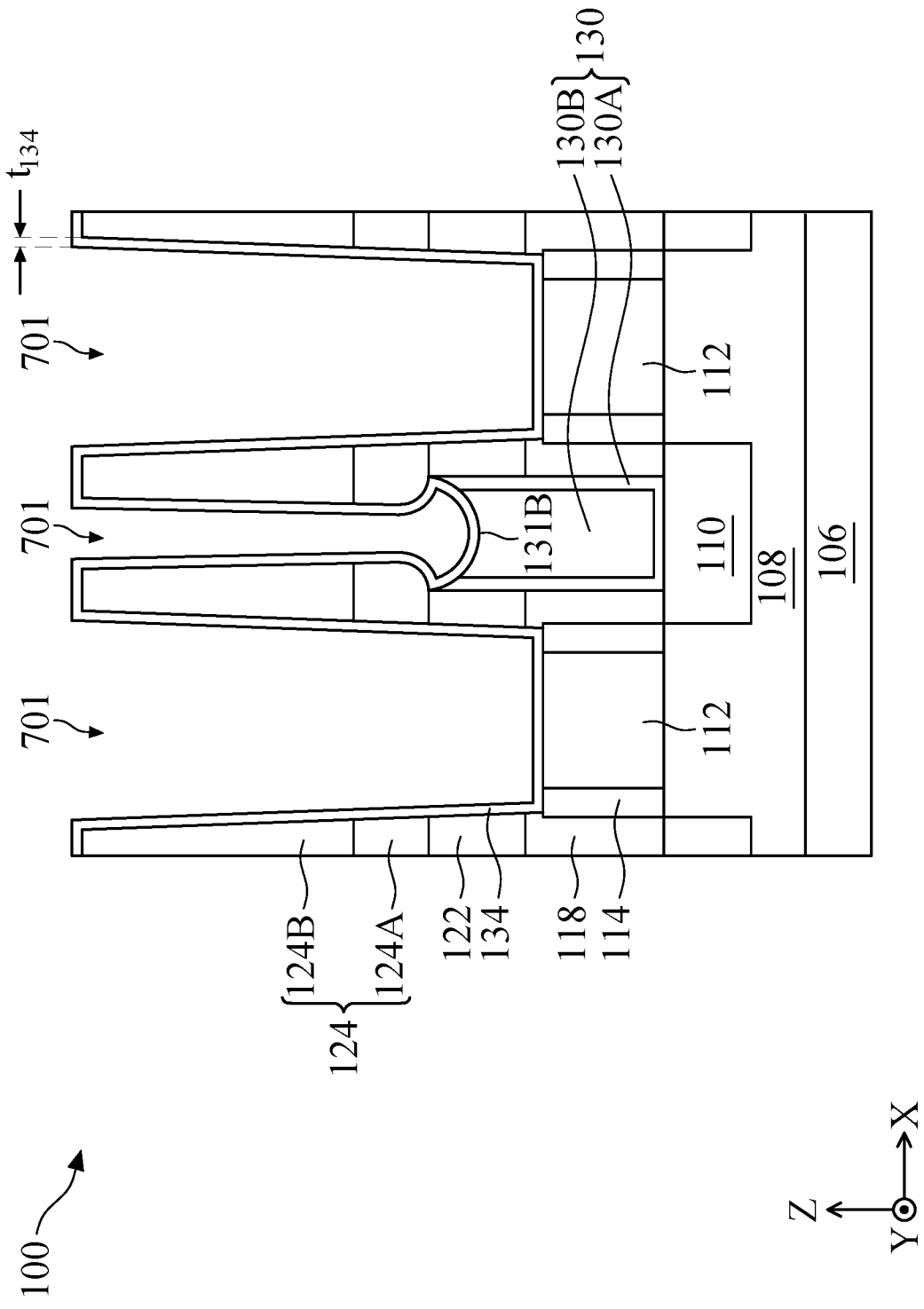
Figure 9B:
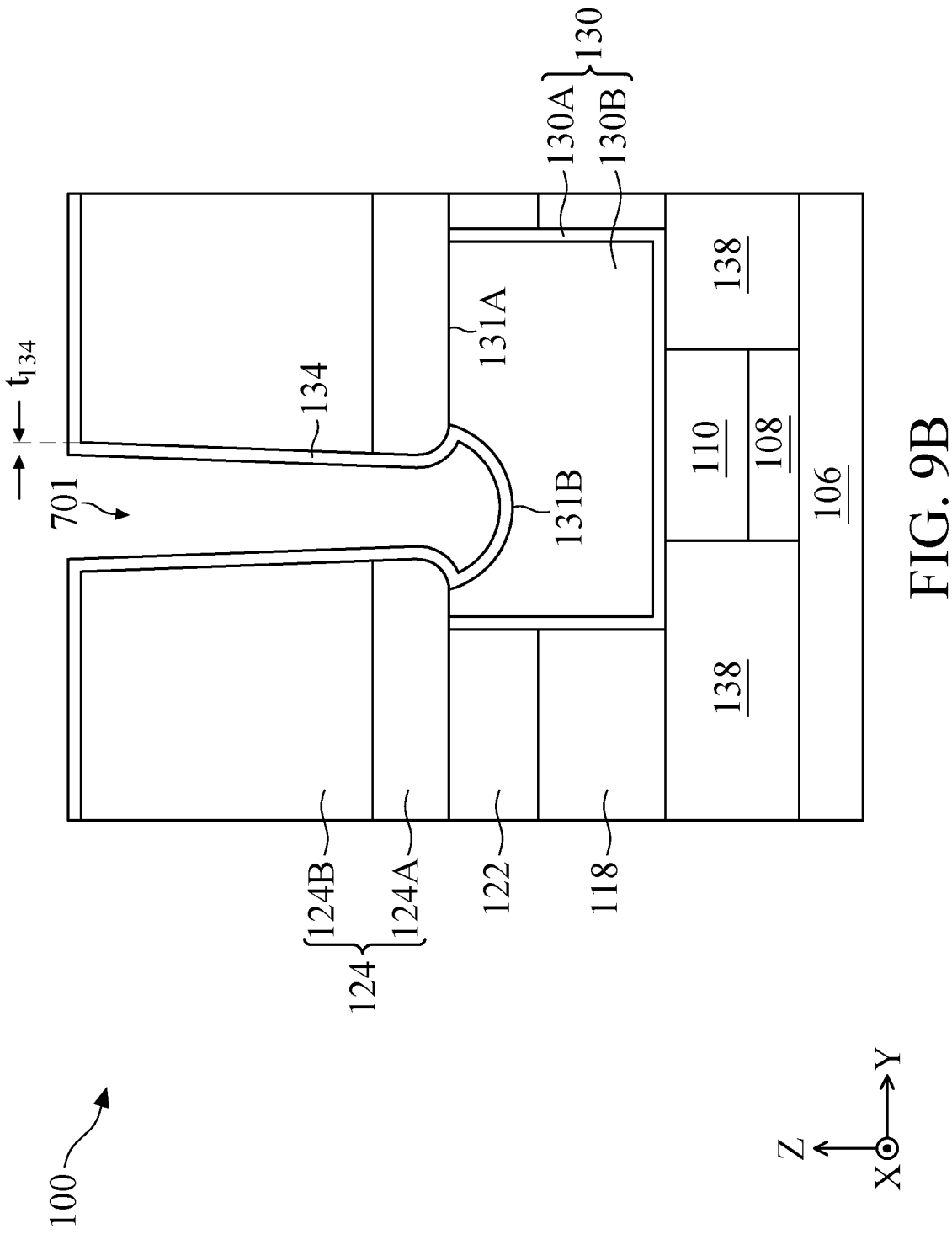
Figure 10A:
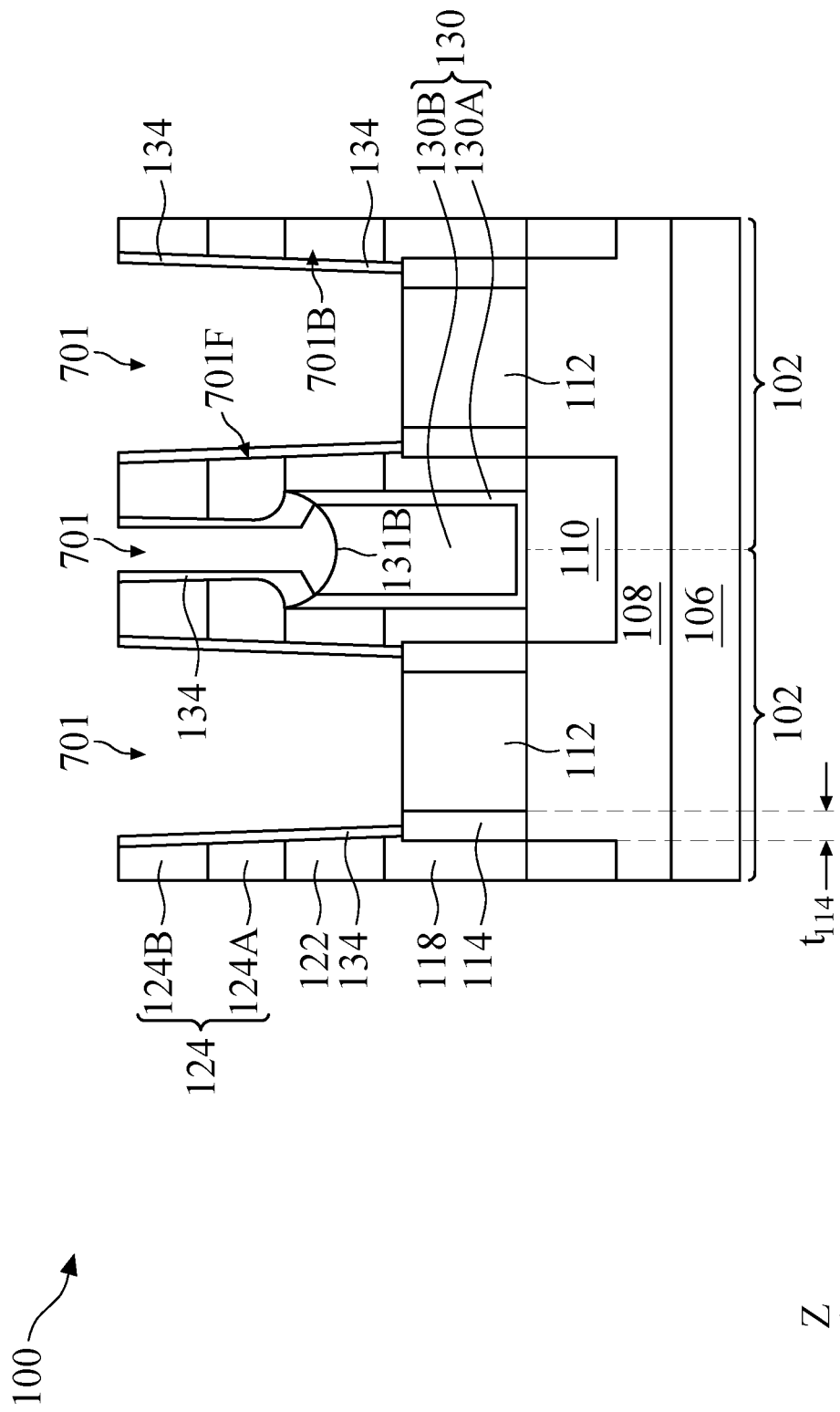
Figure 10B:
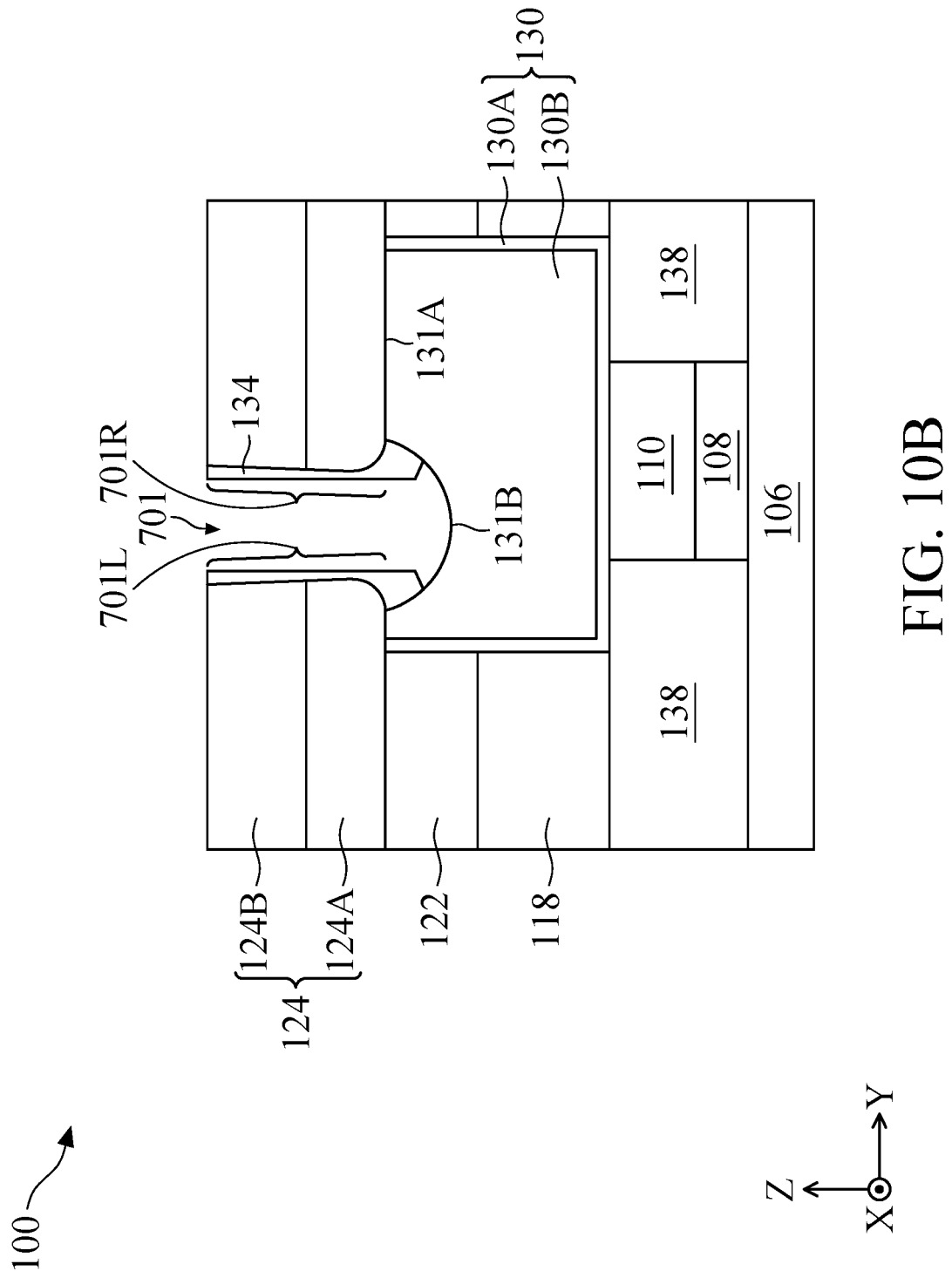

Referring to FIGS. 9A and 9B, the process for forming nucleation layer 134 can include soaking (e.g., exposing to) the structure of FIGS. 8A and 8B (e.g., FIGS. 8A and 8B's layer of dielectric material 124's top surface, ILD layer 122's side surface, gate structure 112, trench conductor layer 130, and side surfaces 701F, 701B, 701L, and 701R) in a metallic-contained gas (e.g., a metallic-contained precursor). In some embodiments, the metallic-contained precursor can be an organometallic gas, such as an organoaluminum gas (e.g., trimethylaluminum, aluminum tris, triisobutylaluminum, tris(dimethylamido)aluminum(III), or trialkylaluminum (C1~C6)) and an organotitanium gas (e.g., tetrakis (dimethylamido) titanium (IV) or titanium halides that includes fluorine, chlorine, and/or bromine). In some embodiments, the metallic-contained precursor can include the metallic element of Al, Hf, Ti, Ta, W, Co, Mo, Ni, Pt, Ru, or Zn. The metallic-contained precursor can dissociatively chemisorb on side surfaces 701F, 701B, 701L, and 701R to form nucleation layer 134 with thickness $t_{134}$ over side surfaces 701F, 701B, 701L, and 701R. The metallic-contained precursor can further dissociatively chemisorb on layer of dielectric material 124's top surface, gate structure 112, and trench conductor layer 130 to form nucleation layer 134 with a thickness substantially equal to thickness $t_{134}$ over layer of dielectric material 124's top surface, gate structure 112, and trench conductor layer 130. Accordingly, nucleation layer 134 can include an identical metallic element as the metallic-contained precursor. In some embodiments, nucleation layer 134 can be an organometallic material that includes an identical metallic element as the metallic-contained precursor. In some embodiments, nucleation layer 134 can be a self-limiting layer, such that the subsequent metallic-contained precursor does not dissociatively chemisorb on nucleation layer 134's surface. Since nucleation layer 134 can be a self-limiting layer, nucleation layer 134's thickness $t_{134}$ can be less than 1 nm, such as from about 0.1 nm to about 0.6 nm, and from about 0.2 nm to about 0.5 nm. In some embodiments, during the soaking of the metallic-contained precursor (e.g., a trimethylaluminum gas), portions of nucleation layer 134 that is in contact with side surfaces 701F, 701B, 701L, and 701R can react with side surfaces 701F, 701B, 701L, and 701R to form a metal oxide layer (e.g., an aluminum oxide layer) that includes an identical metallic element (e.g., aluminum) as the metallic-contained precursor (this embodiment is not shown in FIGS. 9A and 9B).

In some embodiments, to dissociatively chemisorb the metallic-contained precursor on the structure of FIGS. 8A and 8B, substrate 106 can be heated to a temperature from about 20° C. and about 60° C. while soaking the structure of FIGS. 8A and 8B with the metallic-contained precursor to form nucleation layer 134. If the substrate 106's temperature is less than the above-noted lower limit, the metallic-contained precursor may not require sufficient thermal energy to decompose to form nucleation layer 134. If the substrate 106's temperature is greater than the above-noted upper limit, the metallic-contained precursor may not have a sufficient sticking coefficient to adhere to the structure of FIGS. 8A and 8B.

In some embodiments, to dissociatively chemisorb the metallic-contained precursor on the structure of FIGS. 8A and 8B, the ambient pressure of soaking the structure of FIGS. 8A and 8B to form nucleation layer 134 can be from about 1 torr to about 10 torr. If the ambient pressure is less than the above-noted lower limit, there may be insufficient metallic-contained precursor to form nucleation layer 134. If the operating pressure is greater than the above-noted upper limit, the mean free path of the metallic-contained precursor may be reduced, thus inhibiting forming nucleation layer 134 at recess structure 701's bottom portion.

In some embodiments, the soaking time for forming nucleation layer 134 can be from about 3 seconds to about 10 seconds. If the soaking time is less than the above-noted lower limit, the metallic-contained precursor may have insufficient time dissociatively chemisorb on the structure of FIGS. 8A and 8B to form nucleation layer 134. If the soaking time is greater than the above-noted upper limit, the process of forming nucleation layer 134 may have a decreased throughput, thus increasing manufacturing cost of fabricating semiconductor device 100. In some embodiments, after soaking the structure of FIGS. 8A and 8B with the above-noted soaking time to form nucleation layer 134, the process of forming nucleation layer 134 can further include purging nucleation layer 134 with an inert gas, such as nitrogen, to remove excess metallic-contained precursors from the ambient proximate to the structure of FIGS. 9A and 9B.

Referring to FIGS. 10A and 10B, the process of forming nucleation layer 134 can further include performing an etching process to selectively etch a portion of nucleation layer 134 that is on trench conductor layer 130 and gate structure 112 over another portion of nucleation layer 134 that is on side surfaces 701F, 701B, 701L, and 701R. Accordingly, after performing the etching process, trench conductor layer 130 and gate structure 112 can be exposed to recess structures 701 with side surfaces 701F, 701B, 701L, and 701R being capped by nucleation layer 134. The exposed trench conductor layer 130 and exposed gate structure 112 can then be physically in contact with trench conductor layer 132 (e.g., formed at operation 420) to reduce the resistance in between. The portions of nucleation layer 134 that caps side surfaces 701F, 701B, 701L, and 701R can provide a substantially uniform nucleation rate to uniformly deposition the conductive material over surfaces 701F, 701B, 701L, and 701R to form trench conductor layer 132 (discussed at operation 420). In some embodiments, after performing the etching process, an edge portion (e.g., far from top surface portion 131B's bottommost vertex) of trench conductor layer 130's top surface portion 131B can be capped by nucleation layer 134 with a central portion (e.g., proximate to top surface portion 131B's bottommost vertex) being exposed to recess structure 701. In some embodiments, after performing the etching process, nucleation layer 134 can be removed from layer of dielectric material 124's top surface to expose layer of dielectric material 124's top surface.

The etching process for etching nucleation layer 134 can be an anisotropic etching process that can selectively etch nucleation layer 134 over trench conductor layer 130 and gate structure 112. For example, the etching process can be a plasma dry etching process with a dry etchant, such as a chlorine-based gas (e.g., boron trichloride or chlorine gas), that can selectively etch nucleation layer 134 (e.g., such as trimethylaluminum) over trench conductor layer 130 (e.g., such as Mo) and gate structure 112 (e.g., such as W). In some embodiments, the etching process can be performed by mixing the dry etchant with a carrier gas, such as argon and helium, to increase the anisotropy of the etching process. The etching process can be performed with a suitable operating pressure, such as from about 50 mTorr to about 200 mTorr, a suitable substrate 106's temperature, such as from about 50° C. and about 120° C., and a suitable time duration, such as from about 3 seconds to about 15 seconds. The etching process can be further performed with a bias voltage from about 200 volts to about 500 volts to generate the plasma to etch nucleation layer 134. If the bias voltage is below is above-noted lower limit, the dry etchant cannot acquire sufficient energy to form the plasma. If the bias voltage is greater than the above-noted upper limit, the generated plasma may damage the exposed trench conductor layer 130 and the exposed gate structure 112.

Referring to FIG. 4, in operation 415, a trench conductor is formed over the nucleation layer to contact the S/D contact and the gate structure. For example, as shown in FIGS. 13A and 13B, trench conductor layer 132 can be formed over nucleation layer 134 to contact the underlying trench conductor layer 130 and gate structure 112 with references to FIGS. 11A-13A and 11B-13B.

Figure 11A:
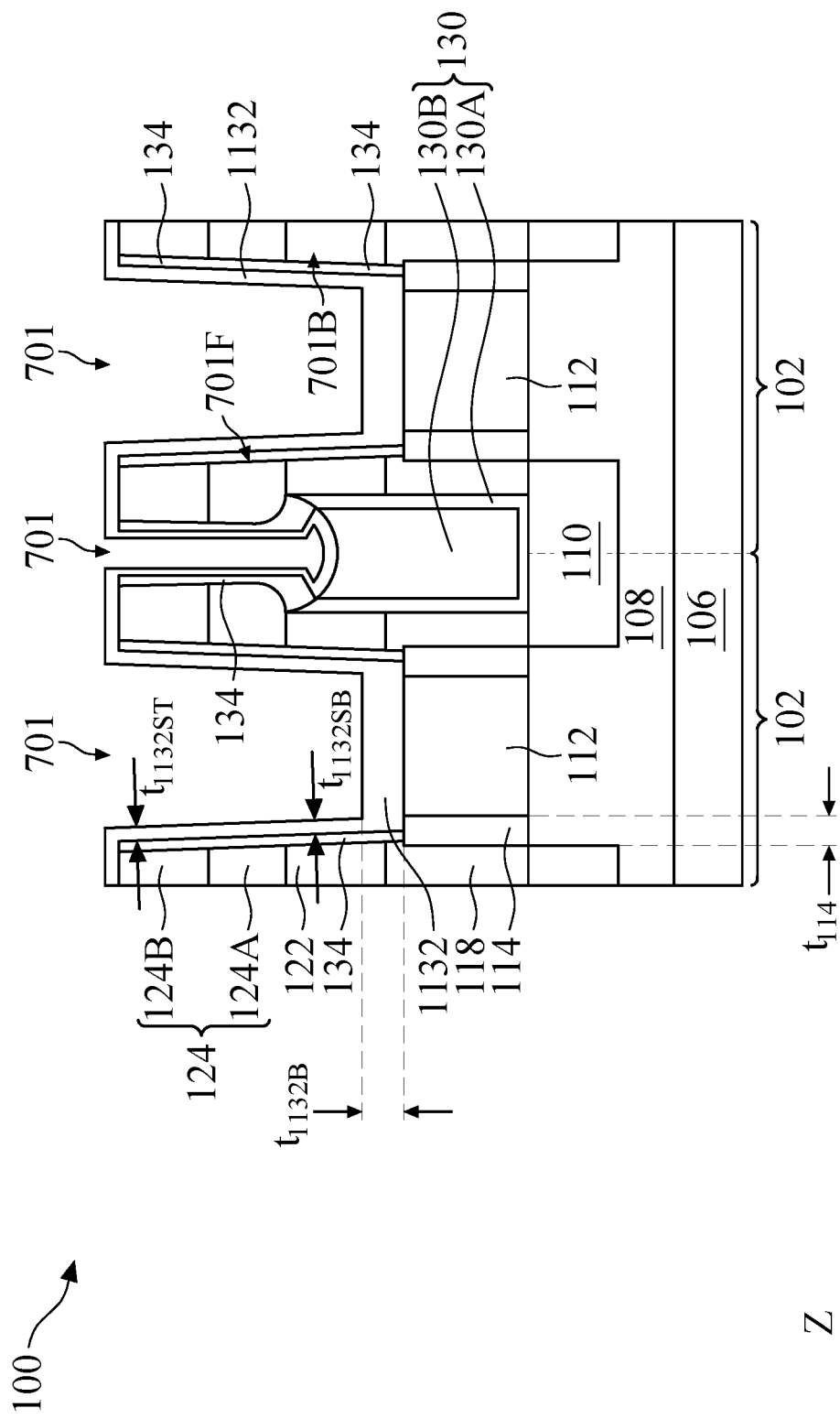
Figure 11B:
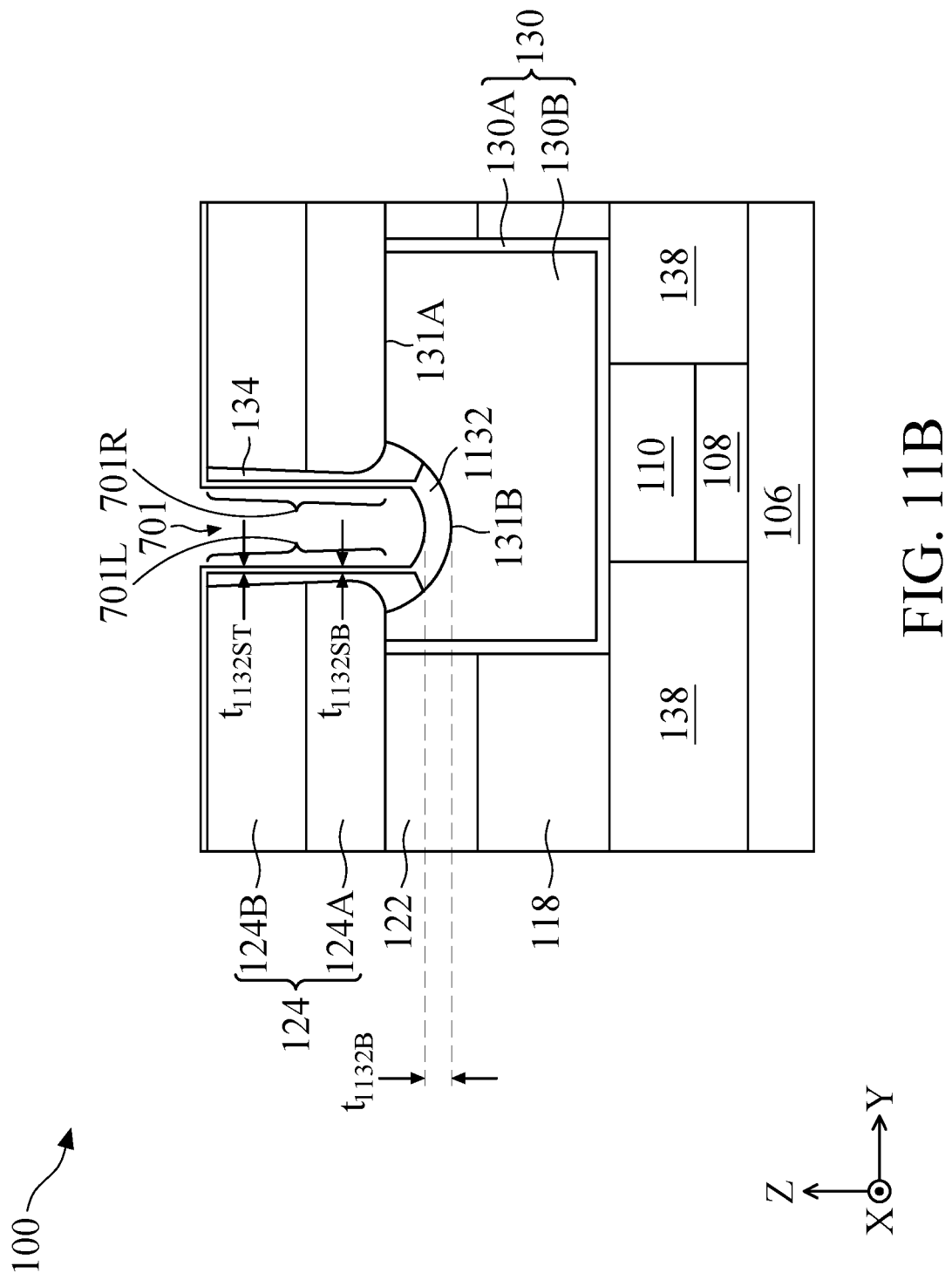

Referring to FIGS. 11A and 11B, the process for forming trench conductor layer 132 can include performing a deposition process, such as a CVD process and an ALD process, on the structure of FIGS. 10A and 10B to deposit a layer of conductive material 1132 in recess structures 701 to contact the underlying trench conductor layer 130 and gate structure 112. Layer of conductive material 1132 can be made of identical materials as trench conductor layer 132. In some embodiments, the deposition process can prevent forming liner structure in recess structure 701, thus rendering trench conductor layer 132 to be a liner-less structure after operation 420.

As previously discussed, nucleation layer 134 that caps side surfaces 701F, 701B, 701L, and 701R can provide a substantially uniform nucleation rate for the deposition process to uniformly deposit the conductive material. Accordingly, the deposition process for forming trench conductor layer 132 can deposit layer of conductive material 1132 with a substantially equal deposition rate proximate to recess structure 701's top portion and proximate to recess structure 701's bottom portion. For example, as shown in FIG. 11A, during the deposition process, layer of conductive material 1132 can have a thickness $t_{1132ST}$ (e.g., in the x-direction) formed over a top portion of side surfaces 701F and 701B and a thickness $t_{1132SB}$ (e.g., in the x-direction) formed over a bottom portion of side surfaces 701F and 701B, where thicknesses $t_{1132ST}$ and $t_{1132SB}$ can be substantially equal to each other. Similarly, as shown in FIG. 11B, during the deposition process, layer of conductive material 1132 can have thickness $t_{1132ST}$ (e.g., in the y-direction) formed over a top portion of side surfaces 701L and 701R and thickness $t_{1132SB}$ (e.g., in the y-direction), substantially equal to thickness $t_{1132ST}$, formed over a bottom portion of side surfaces 701L and 701R. With the deposition rates at recess structure 701's top and bottom portions substantially equal to each other, layer of conductive material 1132 can be substantially conformally deposited over side surfaces 701F, 701B, 701L, and 701R to form a seamless and void-free trench conductor layer 132 after operation 420.

In some embodiments, the deposition process for forming layer of conductive material 1132 can have a higher deposition rate over trench conductor layer 130's top surface and over gate structure 112's top surface than over side surfaces 701F, 701B, 701L, and 701R. Accordingly, the deposition process can mitigate gap-fill challenges due to small opening widths $W_{132A}$ and/or $W_{132B}$ (shown in FIG. 7A) of recess structure 701, thus avoiding forming void structure in trench conductor layer 132 after operation 420. For example, as shown in FIGS. 11A and 11B, during the deposition process, layer of conductive material 1132 can have a thickness $t_{1132B}$ (e.g., in the z-direction) formed over trench conductor layer 130 and/or gate structure 112, where thicknesses $t_{1132SB}$ can be greater than each of thicknesses $t_{1132ST}$ and $t_{1132SB}$.

Figure 12A:
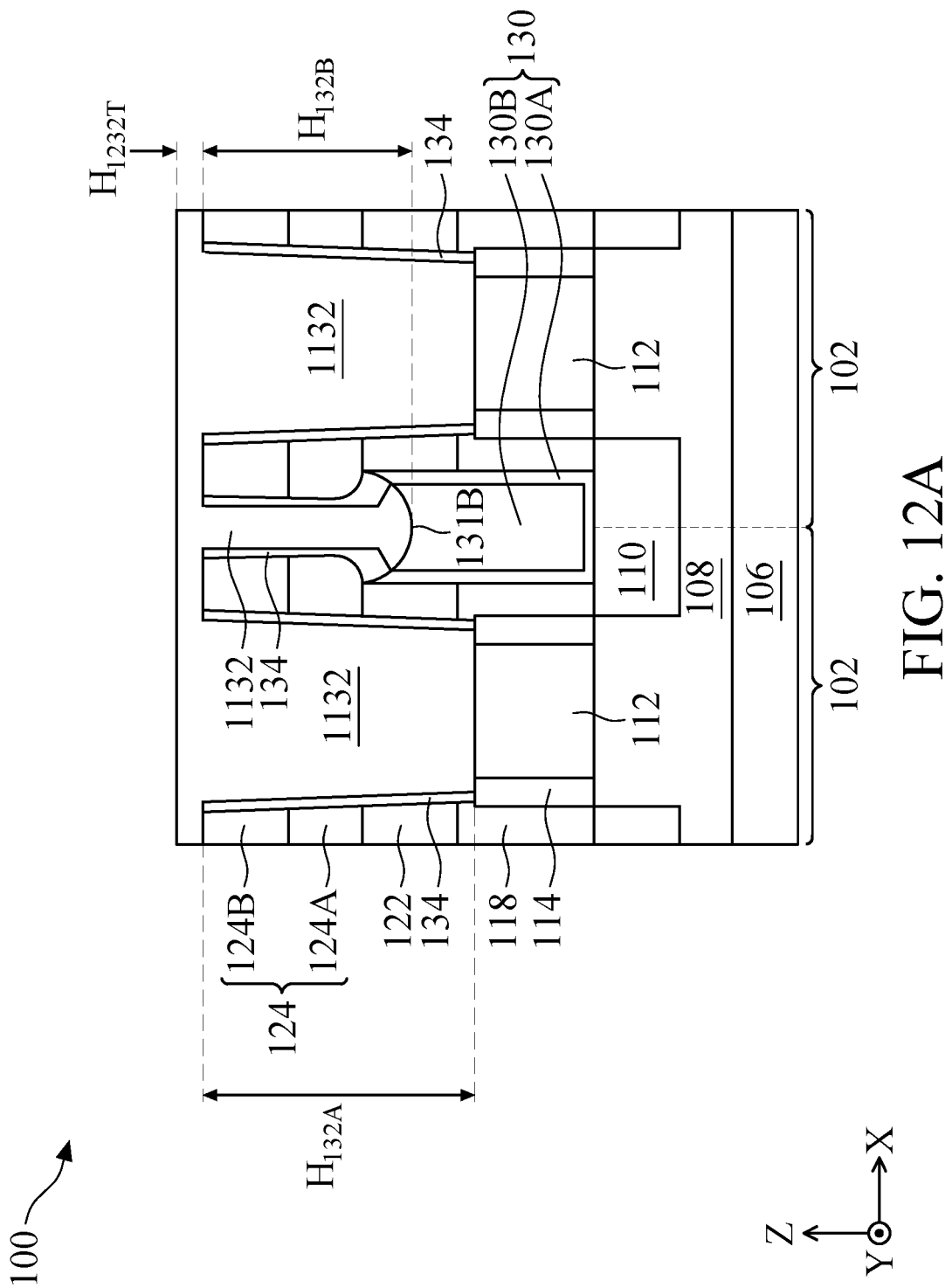
Figure 12B:
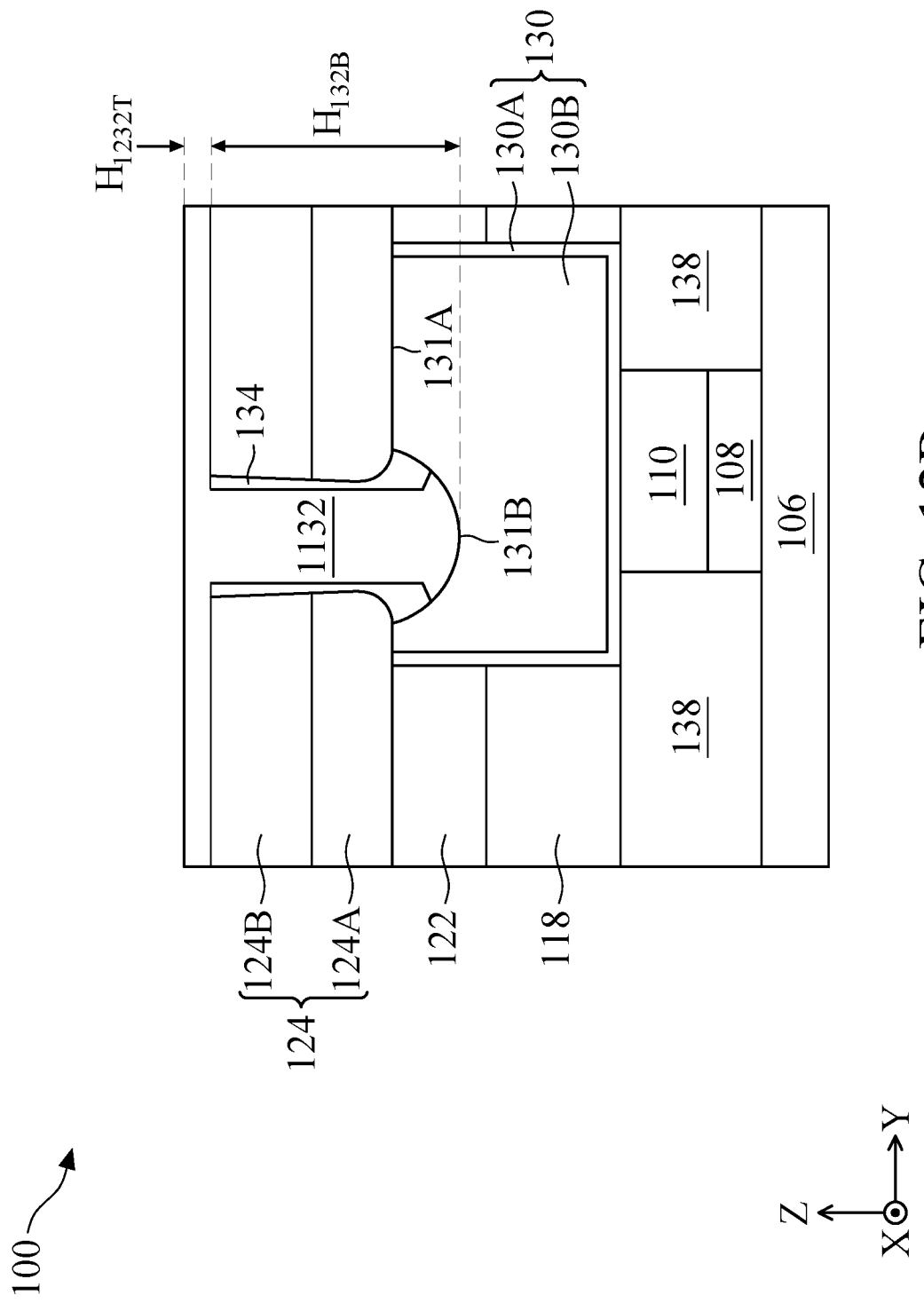
Figure 13A:
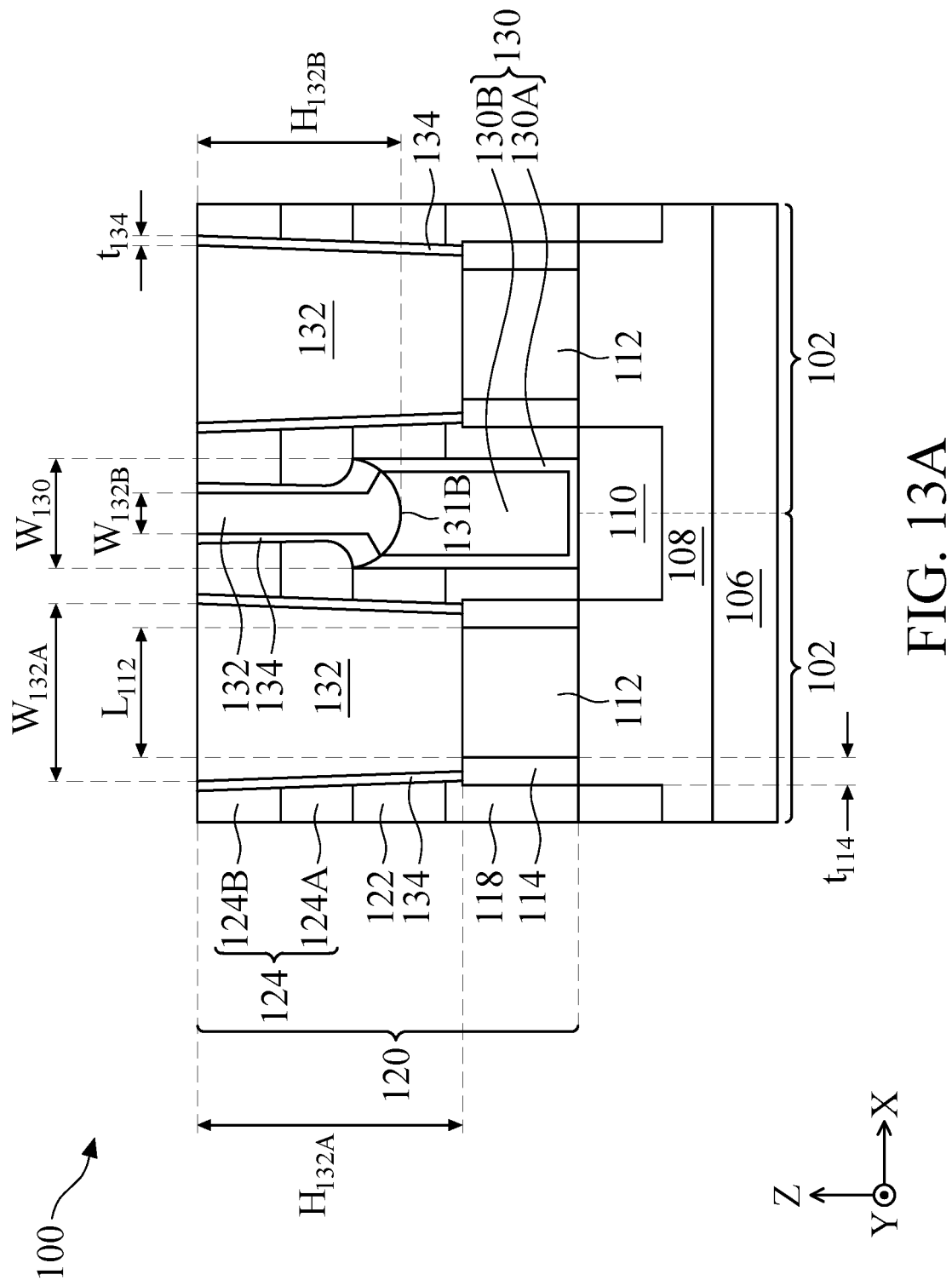
Figure 13B:
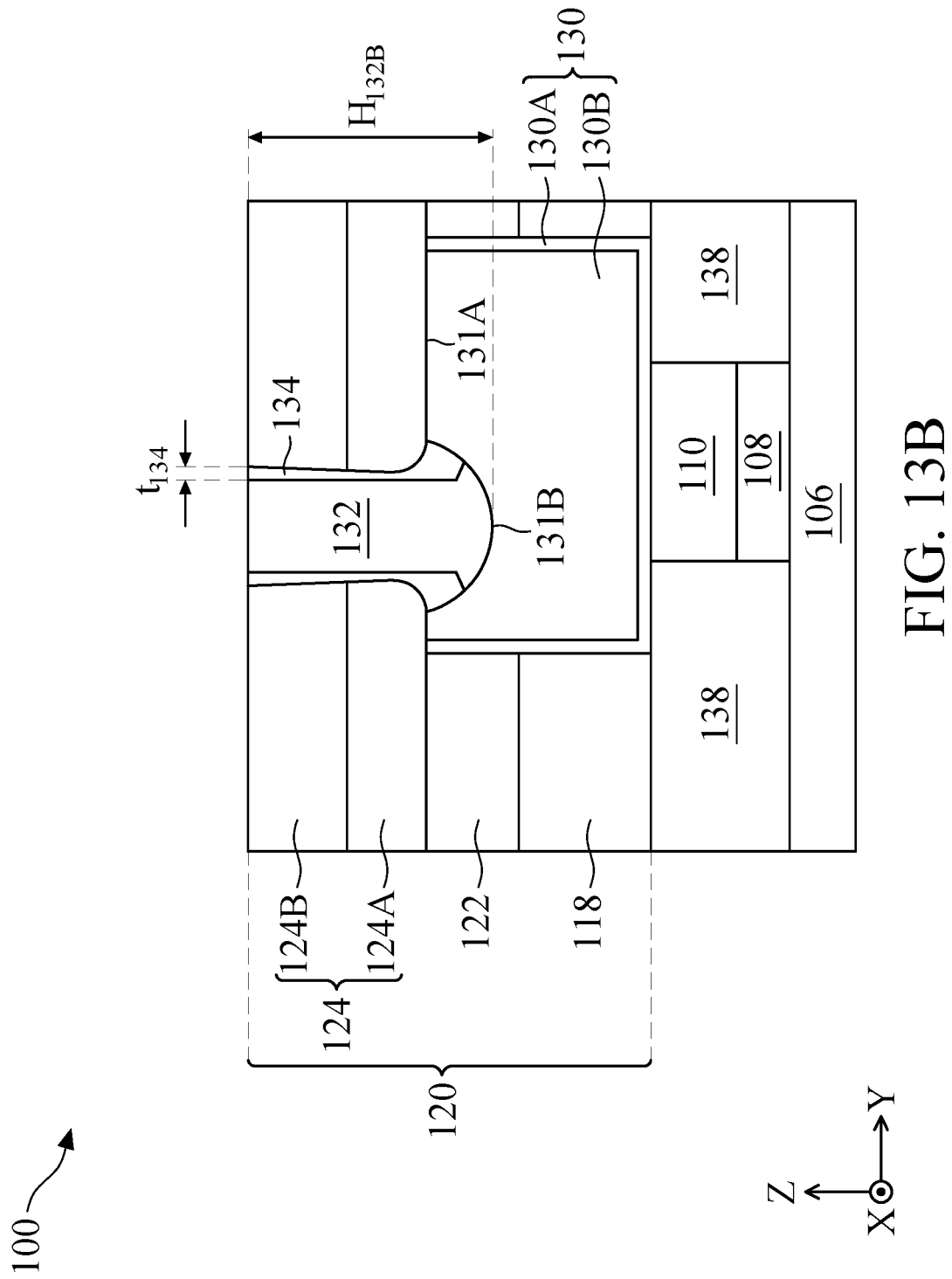

Referring to FIGS. 12A and 12B, the deposition for forming trench conductor layer 132 can last until layer of conductive material 1132 completely seal recess structures 701, such that (i) layer of conductive material 1132 completely covers recess structures 701's side surfaces 701F, 701B, 701L, and 701R, and (ii) portions of layer of metallic material 1132 that is over trench conductor layer 130 and gate structure 112 is vertically (e.g., in the z-direction) higher than adjacent layer of dielectric material 124's top surface. In some embodiments, the deposition process for forming layer of conductive material 1132 can have a higher growth rate in recess structure 701 than over layer of dielectric material 124's top surface, such that the resulting layer of metallic material 1132 can have a vertical (e.g., in the z-direction) dimension $H_{1232T}$ over layer of dielectric material layer 124's top surface less than recess structure 701's heights $H_{132A}$ and/or $H_{132B}$ (e.g., later becoming trench conductor layer 132's height heights $H_{132A}$ and/or $H_{132B}$ after operation 420). In some embodiments, a ratio of vertical dimension $H_{1232T}$ to recess structure 701's heights $H_{132A}$ and/or $H_{132B}$ can be from about 0.06 to about 0.4. If the ratio of vertical dimension $H_{1232T}$ to recess structure 701's heights $H_{132A}$ and/or $H_{132B}$ is less than the above-noted lower limit, layer of dielectric material 124 may be damaged during the subsequent polishing process in operation 415. If the ratio of vertical dimension $H_{1232T}$ to recess structure 701's heights $H_{132A}$ and/or $H_{132B}$ is greater than the above-noted lower limit, the deposition process for forming layer of conductive material 1132 may be susceptible to the gap-fill challenge, thus forming void structures in layer of conductive material 1132.

Referring to FIGS. 13A and 13B, the process for forming trench conductor layer 132 can further include planarizing, such as a chemical mechanical polishing (CMP) process, on the structure of FIGS. 12A and 12B to coplanarize layer of conductive material 1132 with layer of dielectric material 124 to define trench conductor layer 132. Accordingly, operation 420 can result in a trench conductor layer 132 that is (i) substantially coplanar with layer of dielectric material 124 and (ii) in contact with trench conductor layer 130 and gate structure 112. Further, nucleation layer 134 can be between trench conductor layer 132 and side surfaces 701F, 701B, 701L, and 701R after operation 420.

Figure 14A:
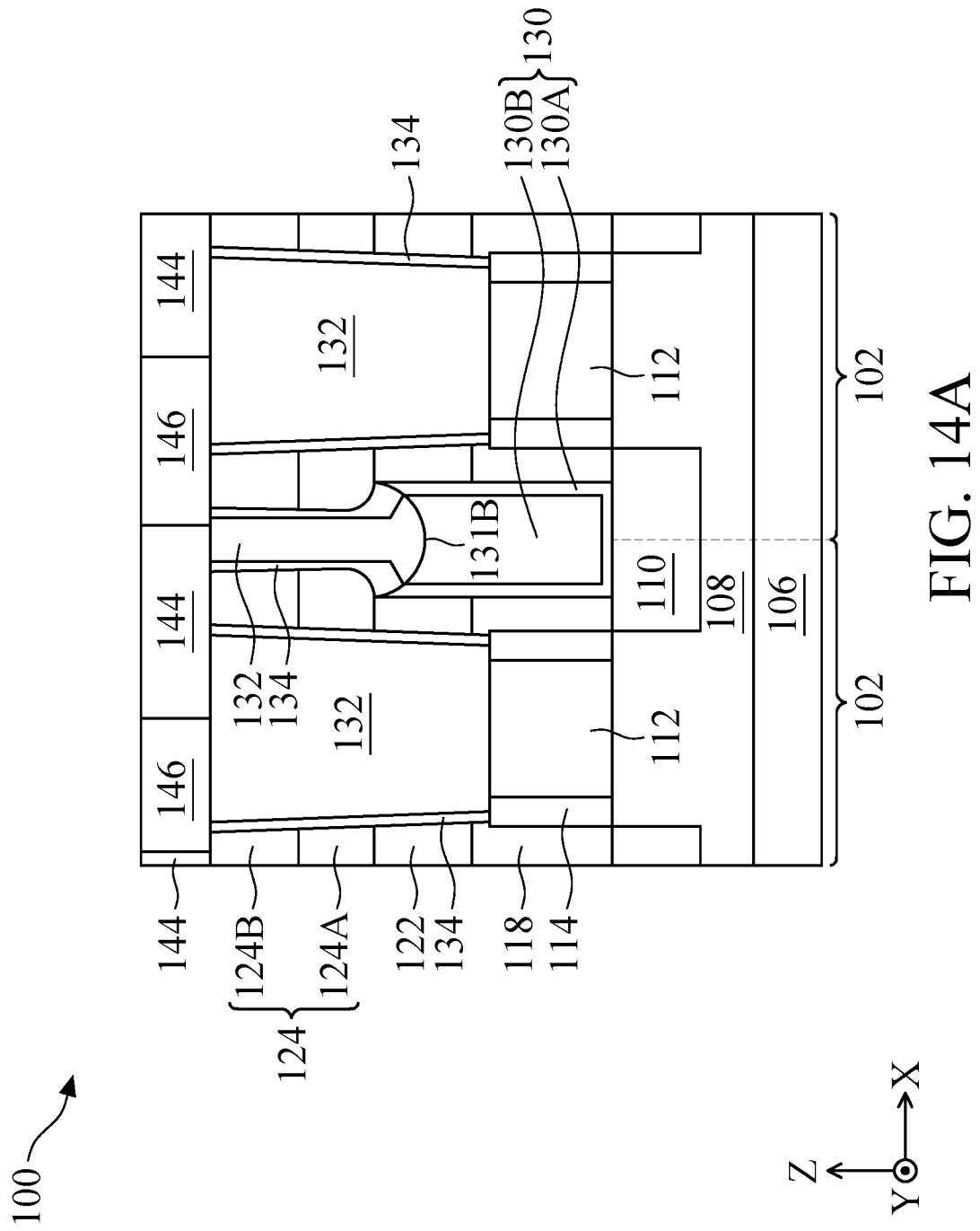
Figure 14B:
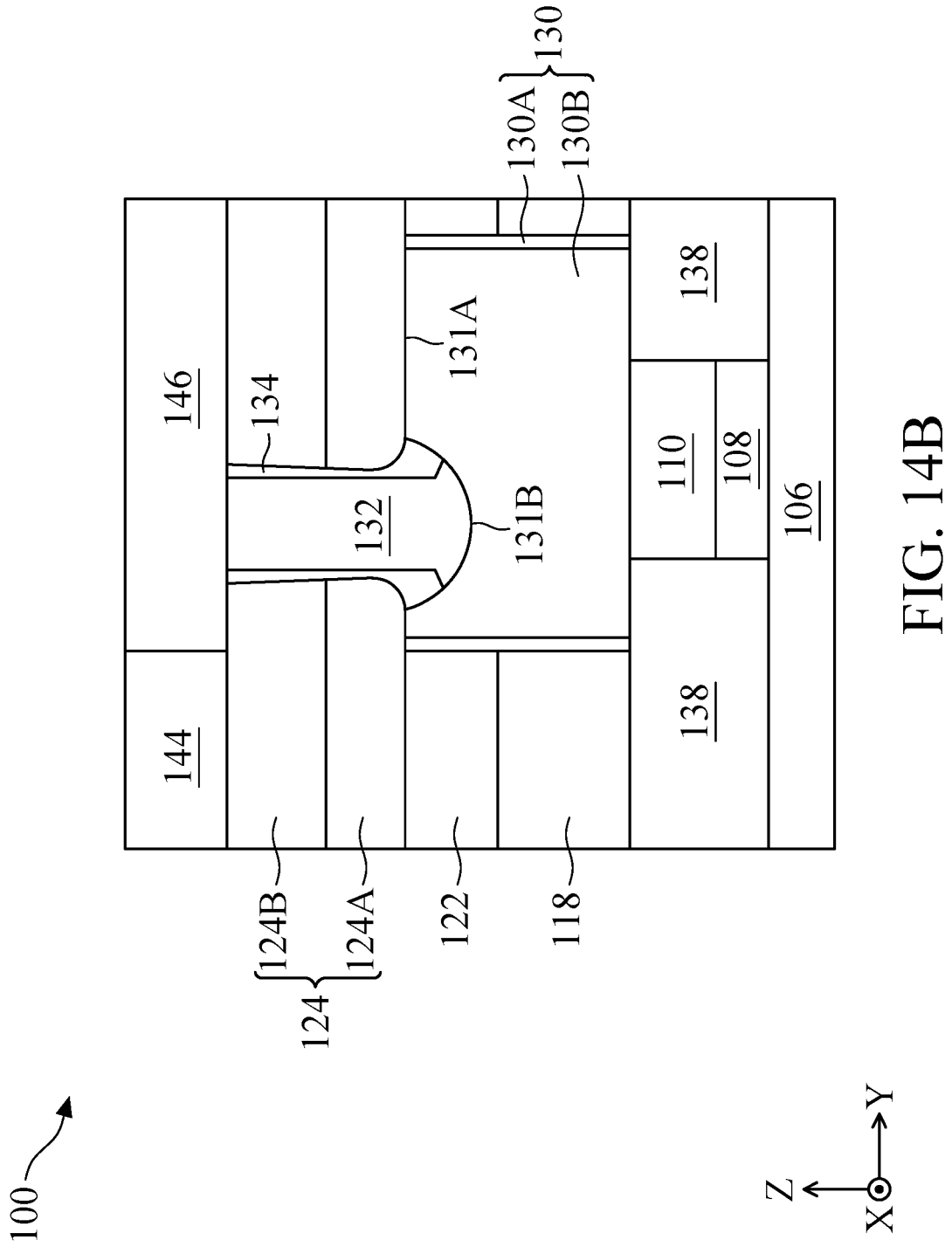

Referring to FIG. 4, in operation 425, an interconnect structure is formed over the trench conductor layer. For example, as shown in FIGS. 1, 2A and 2B, interconnect structure 140 can be formed over trench conductor layers 132 as described in reference to FIGS. 14A, 14B, 1, 2A, and 2B. Referring to FIGS. 14A and 14B, a process of forming interconnect structure 140 can include (i) forming a patterned layer of insulating material 144 over the structure of FIGS. 13A and 13B to expose trench conductor layers 132 using a deposition process and an etching process, (ii) blanket depositing a conductive material over the patterned layer of insulating material 144 using a deposition process, and (iii) polishing the deposited conductive material using a CMP process to form layer of conductive material 146 substantially coplanar with layer of insulating material 144. In some embodiments, layer of insulating material 144 and/or layer of conductive material 146 can be formed over and in contact with nucleation layer 134.

The process of forming interconnect structure 140 can further include (i) blanket depositing layer of insulating material 148 (shown in FIGS. 2A and 2B) over the structure of FIGS. 14A and 14B using a deposition process, such as a CVD process, a PECVD process, a PVD process, and an ALD process, (ii) forming one or more recess structures (not shown in FIGS. 14A and 14B) through layer of insulating material 148 using a lithography process and an etching process, and (iii) filling the one or more recess structures with a conductive material to form trench conductor layers 162 (shown in FIGS. 2A and 2B) using a deposition process (e.g., CVD, ALD, PVD, or e-beam evaporation) and a polishing process (e.g., a CMP process).

The present disclosure provides a contact structure and a method for forming the same. The contact structure can contact an interconnect structure to a transistor structure's S/D region. The contact structure can further contact the interconnect structure to a transistor structure's gate structure. The contact structure can include a trench conductor layer formed through a dielectric layer. The trench conductor layer can be made of a conductive material, such as Ru. The contact structure can further include an organometallic layer, such as a organoaluminum layer, formed over the trench conductor layer's side surfaces. The organometallic layer can be formed by soaking the dielectric layer's side surfaces by a metallic-contained precursor, such as a trimethylaluminum gas, prior to a deposition process (e.g., a CVD process) that is used to deposit the conductive material to form the trench conductor layer. The organometallic layer can ensure a uniform deposition rate (e.g., a conformal growth) of the conductive material (e.g., Ru) over the dielectric layer's side surface. With the conformal growth of the conductive material over the dielectric layer's side surface, the conductive material grown at an upper portion of the dielectric layer's side surface does not pinch-off before finishing the growth of the conductive material at a lower portion of the dielectric layer's side surface. Accordingly, a benefit of the present disclosure, among others, is to provide the contract structure with enhanced structural integrity (e.g., without voids), thus enhancing an overall reliability and performance of the IC.

In some embodiments, a semiconductor structure can include a substrate, a gate structure over the substrate, a source/drain (S/D) contact structure adjacent to the gate structure, a layer of dielectric material over the S/D contact structure and over the gate structure, a layer of organometallic material formed through the layer of dielectric material, and a trench conductor layer formed through the layer of dielectric material and in contact with the S/D contact structure and the gate structure. The layer of organometallic material can be between the layer of dielectric material and the trench conductor layer.

In some embodiments, a method for forming a semiconductor structure can include forming a gate contact structure over a substrate, forming a layer of dielectric material over the gate structure, forming a recess structure in the layer of dielectric material to expose the gate structure, forming a layer of organometallic material over side surfaces of the recess structure, and forming a trench conductor layer over the layer of organometallic material and in contact with the gate structure.

In some embodiments, a method for forming a semiconductor structure can include forming a gate structure over a substrate, forming a source/drain (S/D) contact structures adjacent to the gate structure, forming a layer of dielectric material over the gate structure and the S/D contact structures, forming first and second recess structures to expose the gate structure and the S/D contact structure, respectively, forming a layer of organometallic material over side surfaces of the first and second recess structures, and depositing a conductive material in the first and second recess structures and over the layer of organometallic material.

The foregoing disclosure outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method for forming a semiconductor structure, comprising:
   forming a gate structure on a substrate;
   forming a layer of dielectric material on the gate structure;
   forming a recess structure in the layer of dielectric material to expose the gate structure and a top surface of a source/drain (S/D) contact structure;
   forming a layer of organometallic material on side surfaces of the recess structure; and
   forming a trench conductor layer on the layer of organometallic material and in contact with the gate structure and the S/D contact structure.

2. The method of claim 1, wherein forming the layer of organometallic material comprises forming the layer of organometallic material with a thickness of about 0.1 nm to about 1 nm.

3. The method of claim 1, wherein forming the layer of organometallic material comprises soaking the side surfaces of the recess structure with a metallic-contained precursor.

4. The method of claim 3, wherein soaking the side surfaces comprises soaking the side surfaces at a temperature of about 20° C. to about 60° C.

5. The method of claim 1, wherein forming the layer of organometallic material comprises etching a bottom portion of the layer of organometallic material to expose the gate structure.

6. The method of claim 1, wherein forming the trench conductor layer comprises depositing the trench conductor layer on upper and lower portions of the side surface of the recess structure with deposition rates substantially equal to each other.

7. The method of claim 1, wherein forming the trench conductor layer comprises depositing the trench conductor layer on the layer of organometallic material with a first deposition rate and on the gate structure with a second deposition rate higher than the first deposition rate.

8. A method for forming a semiconductor structure, comprising:
   forming a gate structure on a substrate;
   forming a source/drain (S/D) contact structure adjacent to the gate structure;
   forming a layer of dielectric material on the gate structure and the S/D contact structure;
   forming first and second recess structures to expose the gate structure and the S/D contact structure, respectively;
   forming a layer of organometallic material with first layer portions on side surfaces of the first and second recess structures; and
   depositing a conductive material in the first and second recess structures and on the first layer portions of the layer of organometallic material.

9. The method of claim 8, wherein forming the layer of dielectric material comprises forming first and second portions of the layer of dielectric material on the gate structure and the S/D contact structure, respectively, and
   wherein forming the first and second recess structures comprises concurrently etching the first and second portions of the layer of dielectric material.

10. The method of claim 8, wherein forming the layer of organometallic material comprises soaking the first and second recess structures with an organometallic gas.

11. The method of claim 8, wherein forming the layer of organometallic material comprises forming the layer of organometallic material with second layer portions on the gate structure and the S/D contact structure.

12. The method of claim 8, wherein forming the layer of organometallic material comprises:
   forming the layer of organometallic material with second layer portions on top surfaces of the S/D contact structure and the gate structure; and
   etching the second layer portions of the layer of organometallic material prior to depositing the conductive material.

13. The method of claim 8, wherein depositing the conductive material comprises depositing the conductive material on the layer of organometallic material with a first deposition rate and on the gate structure with a second deposition rate higher than the first deposition rate.

14. A method, comprising:
   forming a gate structure on a fin structure;
   forming gate spacers along sidewalls of the gate structure;
   depositing a dielectric layer on the gate structure;
   forming an opening in the dielectric layer to expose a top surface of the gate structure and top surfaces of the gate spacers;
   performing a soaking process on sidewalls of the opening and top surfaces of the gate structure, the gate spacers, and the dielectric layer with a metal-containing precursor gas to form a metallic layer;
   removing portions of the metallic layer from the top surfaces of the gate structure, the gate spacers, and the dielectric layer; and
   depositing a conductive layer in the opening.

15. The method of claim 14, further comprising performing an anneal process on the metallic layer prior to removing the portions of the metallic layer.

16. The method of claim 14, further comprising performing a polishing process to substantially coplanarize a top surface of the conductive layer with the top surface of the dielectric layer.

17. The method of claim 14, wherein performing the soaking process comprises exposing the sidewalls of the opening and the top surfaces of the gate structure and the dielectric layer to an aluminum-containing precursor gas, a hafnium-containing precursor gas, a titanium-containing precursor gas, a tantalum-containing precursor gas, a tungsten-containing precursor gas, or a ruthenium-containing precursor gas.

18. The method of claim 14, wherein performing the soaking process comprises exposing the sidewalls of the opening and the top surfaces of the gate structure and the dielectric layer to an organometallic precursor gas.

19. The method of claim 14, wherein performing the soaking process comprises forming the metallic layer with a thickness of about 0.1 nm to about 0.6 nm.

20. The method of claim 14, wherein depositing the conductive layer comprises depositing a conductive material on the gate structure with a first deposition rate and on the metallic layer in the opening with a second deposition rate lower than the first deposition rate.

* * * * *